United States Patent [19]
Woodhill et al.

[11] Patent Number: 5,649,196
[45] Date of Patent: Jul. 15, 1997

[54] SYSTEM AND METHOD FOR DISTRIBUTED STORAGE MANAGEMENT ON NETWORKED COMPUTER SYSTEMS USING BINARY OBJECT IDENTIFIERS

[75] Inventors: James R. Woodhill, Houston; Louis R. Woodhill, Richmond; William Russell More, Jr.; Jay Harris Berlin, both of Houston, all of Tex.

[73] Assignee: Legent Corporation, Pittsburgh, Pa.

[21] Appl. No.: 555,376

[22] Filed: Nov. 9, 1995

Related U.S. Application Data

[63] Continuation of Ser. No. 85,596, Jul. 1, 1993, abandoned.

[51] Int. Cl.$^6$ ..................................................... G06F 11/00
[52] U.S. Cl. .................. 395/620; 395/610; 395/618; 395/200.03; 395/489; 395/497.04; 395/185.01; 395/183.17; 395/182.04; 395/180; 364/DIG. 1; 364/285; 364/285.1; 364/284.4
[58] Field of Search ........................ 395/610, 618, 395/620, 200.03, 489, 497.04, 185.01, 183.17, 182.04, 180; 364/DIG. 1

[56] References Cited

U.S. PATENT DOCUMENTS

| | | | |
|---|---|---|---|
| 4,616,315 | 10/1986 | Logsdon et al. | 364/200 |
| 5,133,065 | 7/1992 | Cheffetz et al. | 395/575 |
| 5,202,982 | 4/1993 | Gramlich et al. | 395/600 |
| 5,235,601 | 8/1993 | Stallmo et al. | 371/40.1 |
| 5,239,637 | 8/1993 | Davis et al. | 395/425 |
| 5,239,659 | 8/1993 | Rudeseal et al. | 395/800 |
| 5,274,802 | 12/1993 | Altine | 395/600 |
| 5,278,838 | 1/1994 | Ng et al. | 371/10.1 |
| 5,295,258 | 3/1994 | Jewett et al. | 395/575 |
| 5,367,698 | 11/1994 | Webber et al. | 395/800 |

OTHER PUBLICATIONS

The 8th International Conference on Distributed Computing Systems, 13 Jun. 1988, San Jose, California pp. 471–479 (Relevant to claim No. 1, 2, 5, 8, 9, 18, 19) Daniel Barbara et al. 'Exploiting symmetries for low–cost comparison of file copies' see p. 471, right col., line 29–p. 472, left col., line 10 (Relevant to claim No. 3, 4, 6, 10–14, 20.
Computer Technology Review, vol. 12, No. 10, Aug. 1992, Los Angeles US pp. 55–60 Daniel Masters 'Distributed Network Processing Speeds Up Network Backup' see p. 60, left col., line 18–line 31 (Relevant claim No. 10).

*Primary Examiner*—Paul V. Kulik
*Assistant Examiner*—Jean R. Homere
*Attorney, Agent, or Firm*—Kirkpatrick & Lockhart LLP

[57] ABSTRACT

The present invention is directed to a system and method for the distributed management of the storage space and data on a networked computer system wherein the networked computer system includes at least two storage devices for storing data files comprised of one or more binary objects. The distributed storage management system includes a device for selectively copying the binary objects stored on one of the storage devices to another of the storage devices and another device for calculating a current value for a binary object identifier for selected binary objects stored on the storage devices wherein the calculation of the binary object identifier is based upon the actual data contents of the associated binary object. The distributed storage management system further includes a device for storing the current value of the binary object identifier as a previous value of the binary object identifier, another device for comparing the current value of the binary object identifier associated with a particular binary object to one or more previous values of the binary object identifier associated with that particular binary object and a device for commanding the device for selectively copying binary objects in response to the device for comparing.

18 Claims, 14 Drawing Sheets

25

| | Record Type | —36 |
|---|---|---|
| File Ident. Record 34 | File Location | —38 |
| | File Name | —40 |
| | Migration Status | —41 |
| | Management Class | —43 |
| | ⋮ | |
| Backup Instance Record 42 | Link To File Identification Record | —44 |
| | Backup Cycle Identifier | —46 |
| | File Size | —48 |
| | Last Modified Date/Time | —50 |
| | Last Access Date/Time | —52 |
| | File Attributes | —54 |
| | Delete Date | —56 |
| | Insert Date | —57 |
| | ⋮ | |
| Binary Object Ident. Record 58 | Link To Backup Instance Record | —60 |
| | Binary Object Stream Type | —62 |
| 74 Binary Object Identifier | Binary Object Size | —64 |
| | Binary Object CRC 32 | —66 |
| | Binary Object LRC | —68 |
| | Binary Object Hash | —70 |
| | Binary Object Offset | —72 |
| | ⋮ | |

FIG. 3

SYSTEM AND METHOD FOR DISTRIBUTED STORAGE MANAGEMENT ON NETWORKED COMPUTER SYSTEMS USING BINARY OBJECT IDENTIFIERS

This application is a continuation application Ser. No. 08/085,596 filed on Jul. 1, 1993, now abandoned.

BACKGROUND OF THE INVENTION

1. Field of the Invention

The present invention is directed generally to a system and method for distributed storage management on a networked computer system and, more specifically, to a system and method for distributed storage management on a networked computer system including a remote backup file server and one or more local area networks in communication with the remote backup file server.

2. Description of the Background of the Invention

Backup copies of information stored on a computer system must be made so that if a failure occurs which causes the original copies of the data to be lost, the lost data can be recovered as it existed at the time when the last backup copy was made. Backup/restore systems have a long history on all types of computer systems from mainframes to minicomputers, local area network file servers and desktop workstations.

Historically, backup systems have operated by making copies of a computer system's files on a special backup input/output device such as a magnetic tape drive, floppy diskette drive, or optical disk drive. Most systems allow full backup, partial backup (e.g., specified drives, directories, or files), or incremental backups based on files changed after a certain date or time. Copies of files made during a backup procedure are stored on these special backup devices and are then later retrieved during a restore operation either under file names derived from the original file, from the date/time of the backup operation or from a serially-incremented number. The backup procedure is typically accomplished on an individual computer/file server basis, rather than through a single coordinated approach encompassing multiple systems. That is, the computer resources of two computers at most (the one processing the files to be backed up and the one with the backup device attached) are employed to effect the backup process, regardless of the actual number of computers networked together.

Today, the absolute numbers of computers networked together by organizations are increasing rapidly as is the number of different types of computers and operating systems in use. At the same time, the number of storage devices and the capacities incorporated into each of these units is growing even more rapidly. In this environment, the backup/restore approaches which have been traditionally used have become less reliable, more expensive, and more consumptive of human time and attention.

Thus, the need exists for a system designed to overcome the limitations of the existing backup/restore systems that have the following characteristics: (1) is capable of operating on a networked computer system incorporating various types of computers and operating systems; (2) is capable of accommodating a large array of large capacity storage devices; (3) is reliable; (4) is capable of operating with a minimum amount of human intervention; and (5) is relatively inexpensive.

SUMMARY OF THE INVENTION

The present invention is directed to a system for the distributed management of the storage space and data on a networked computer system wherein the networked computer system includes at least two storage devices for storing data files comprised of one or more binary objects. The distributed storage management system includes means for selectively copying the binary objects stored on one of the storage devices to another of the storage devices and means for calculating a current value for a binary object identifier for selected binary objects stored on the storage devices wherein the calculation of the binary object identifier is based upon the actual data contents of the associated binary object. The distributed storage management system further includes means for storing the current value of the binary object identifier as a previous value of the binary object identifier, means for comparing the current value of the binary object identifier associated with a particular binary object to one or more previous values of the binary object identifier associated with that particular binary object and means for commanding the means for selectively copying binary objects in response to the means for comparing.

The present invention is further directed to a method for the management of the storage space and data on a computer system wherein the computer system includes at least two storage area for storing data files comprised of one or more binary objects. The storage space management method includes the following steps: (1) selectively copying the binary objects stored in one of the storage areas to another of the storage areas; (2) calculating a current value for a binary object identifier for selected binary objects stored in the storage areas wherein the calculation of the binary object identifier is based upon the actual data contents of the associated binary object; (3) storing the current value of the binary object identifier as a previous value of the binary object identifier; (4) comparing the current value of the binary object identifier associated with a particular binary object to one or more previous values of the binary object identifier associated with that particular binary object; and (5) controlling the step for selectively copying binary objects in response to the step for comparing.

The system and method of the present invention for the management of the storage space on a computer system provide a backup/restore system that is capable of operating on a networked computer system incorporating various types of computers and operating systems, is capable of accommodating a large array of large capacity storage devices, is reliable, is capable of operating with a minimum amount of human intervention and is relatively inexpensive. These and other advantages and benefits of the present invention will become apparent from the description of a preferred embodiment hereinbelow.

BRIEF DESCRIPTION OF THE DRAWINGS

For the present invention to be clearly understood and readily practiced, a preferred embodiment will now be described, by way of example only, with reference to the accompanying figures wherein:

FIG. 3 illustrates the File Database utilized by the Distributed Storage Manager program of the present invention;

DETAILED DESCRIPTION OF THE PREFERRED EMBODIMENT

Figure 1:
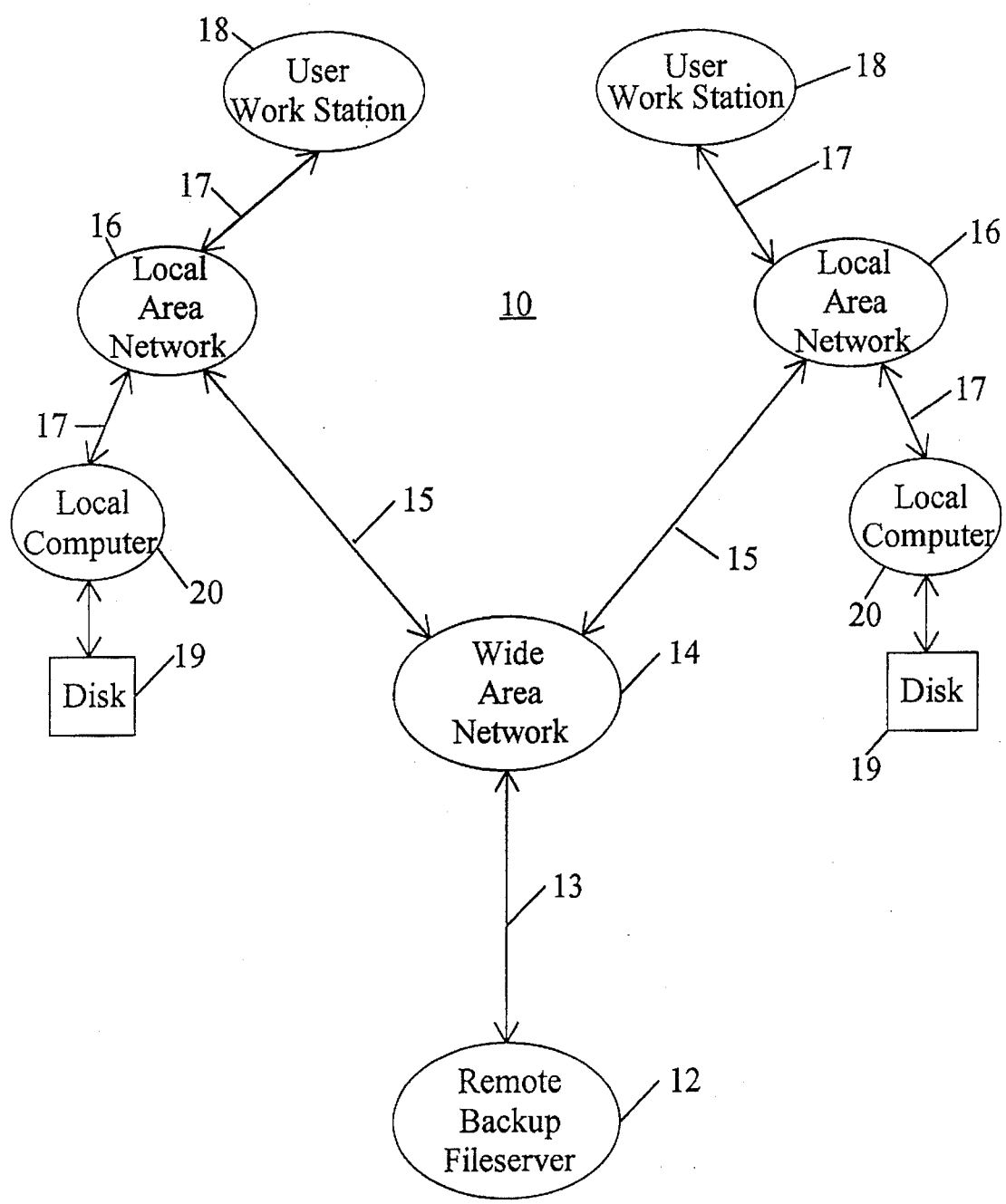
FIG. 1 illustrates a simplified representation of a networked computer system in which the system and method of the present invention may be employed.

FIG. 1 illustrates a simplified representation of a typical networked computer system 10 in which the system and method of the present invention for distributed storage management on networked computer systems may be employed. A remote backup file server 12 is in communication, via data path 13, with a wide area network 14. The wide area network 14 is, in turn, in communication with a plurality of local area networks 16 via data paths 15. Those of ordinary skill in the art will recognize that any number of wide area networks 14 may be in communication with remote backup file server 12 and that any number of local area networks 16 (from 1 to more than 100) may be in communication with each wide area network 14. Those of ordinary skill in the art will also recognize that the means for communication between remote backup file server 12, wide area network 14 and local area networks 16 over data paths 13 and 15 is well known.

Figure 2:
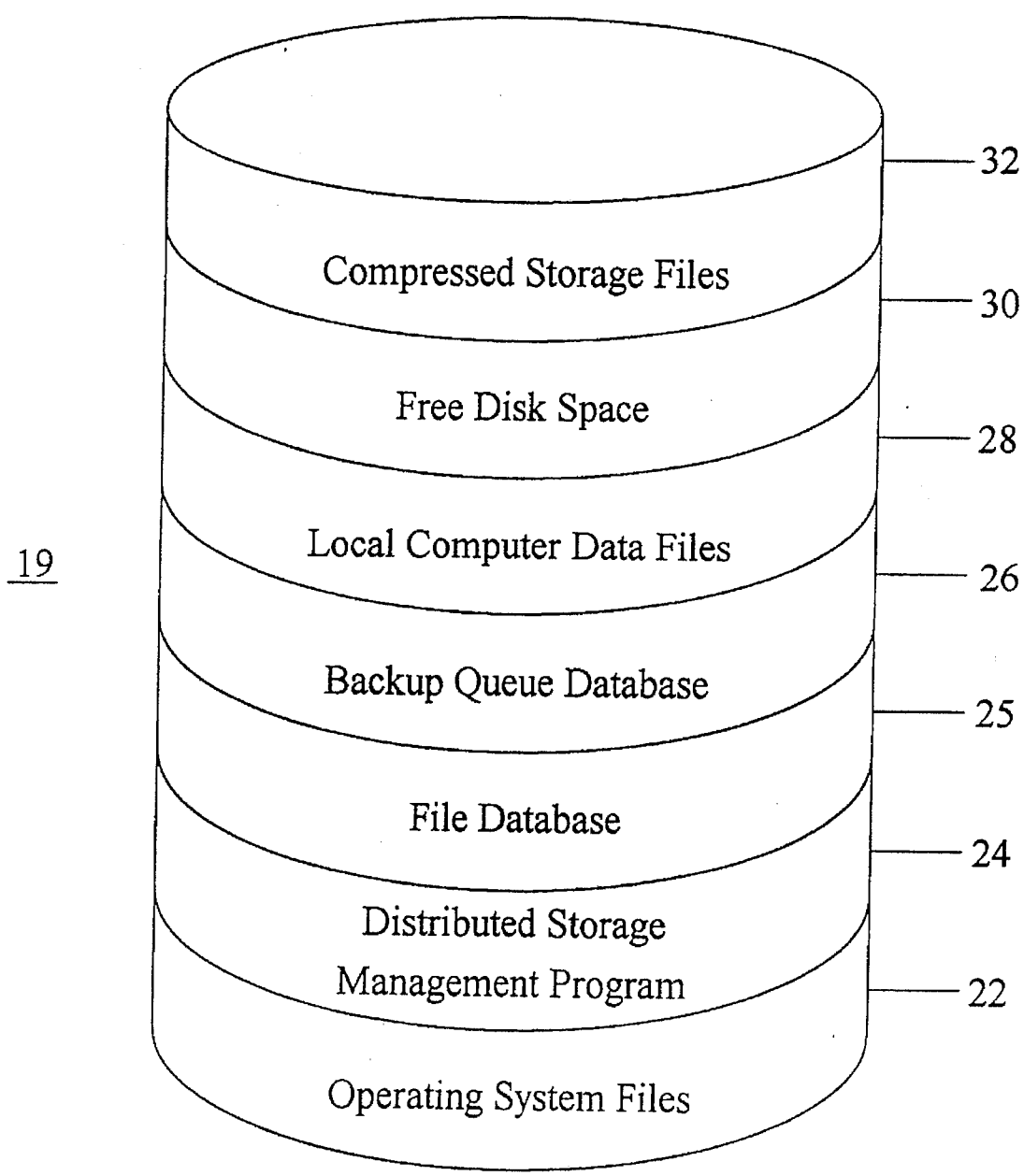
FIG. 2 illustrates the manner in which the Distributed Storage Manager program of the present invention allocates the storage space on each of the storage devices illustrated in FIG. 1.

Each local area network 16 includes multiple user workstations 18 and local computers 20 each in communication with their respective local area network 16 via data paths 17. Again, those of ordinary skill in the art will recognize that the means for communication between user workstations 18, local computers 20 and local area networks 16 via data paths 17 is well known. The storage space on each disk drive 19 on each local computer 20 in the networked computer system 10 is allocated as follows and as is shown in FIG. 2: (1) operating system files 22; (2) a Distributed Storage Manager program 24 which embodies the system and method of the present invention (the operation of which is described in detail hereinbelow); (3) a File Database 25 (the structure of which is described in detail hereinbelow); (4) a Backup Queue Database 26 (the structure of which is described in detail hereinbelow); (5) local computer data files 28; (6) free disk space 30 and (7) compressed storage files 32 (created by the Distributed Storage Manager program 24 of the present invention as is explained more fully hereinbelow).

The Distributed Storage Manager program 24 of the present invention builds and maintains the File Database 25 on one of the disk drives 19 on each local computer 20 in the networked computer system 10 according to the structure illustrated in FIG. 3. The File Database 25 stores information relating to each file that has been backed up by the Distributed Storage Manager program 24 since the initialization of that program on each local computer 20. The File Database 25 is comprised of three levels of records organized according to a predefined hierarchy. The top level record, File Identification Record 34, includes identification information for each file that has been backed up by Distributed Storage Manager program 24. File Identification Record 34 contains the following elements: (1) Record Type 36 (identifies the file as either a directory file or a regular file); (2) File Location 38 (name of the directory in which the file resides); (3) File Name 40 (name of the file); (4) Migration Status 41 (explained more fully hereinbelow); and (5) Management Class 43 (explained more fully hereinbelow).

For each File Identification Record 34 in File Database 25, one or more Backup Instance Records 42 are created that contain information about the file (identified by File Identification Record 34) at the time that the file is backed up.

Each time that a file is backed up, a Backup Instance Record 42 is created for that file. Each Backup Instance Record 42 consists of the following elements: (1) Link to File Identification Record 44; (2) Backup Cycle Identifier 46 (identifies the particular backup cycle during which the Backup Instance Record 42 is created); (3) File Size 48; (4) Last Modified Date/Time 50; (5) Last Access Date/Time 52; (6) File Attributes 54 (e.g., read-only, system, hidden); (7) Delete Date 56 (date on which the file was deleted); and (8) Insert Date 57 (date on which the Backup Instance Record 42 was created).

Associated with each Backup Instance Record 42 is one or more Binary Object Identification Records 58. The Distributed Storage Manager program 24 views a file as a collection of data streams. A data stream is defined as a distinct collection of data within the file that may be changed independently from other distinct collections of data within the file. For example, a file may contain its normal data and may also contain extended attribute data. A user may change the extended attribute data without modifying any of the normal data or vice versa. The Distributed Storage Manager program 24 further divides each data stream into one or more binary objects. If the size of the data stream is equal to or less than a previously defined convenient maximum binary object size (currently one (1) megabyte), then a single binary object represents the data stream. If the data stream is larger than the maximum binary object size, then the Distributed Storage Manager program 24 divides the data stream into multiple binary objects, all but the last of which are equal in size to the maximum binary object size. A Binary Object Identification Record 58 is created for each binary object that comprises the file which was backed up during the backup cycle identified by the Backup Cycle Identifier 46 of a particular Backup Instance Record 42. Each Binary Object Identification Record 58 includes the following components: (1) Link to Backup Instance Record 60; (2) Binary Object Stream Type 62 (e.g., data, extended attributes, security); (3) Binary Object Size 64; (4) Binary Object CRC32 66 (explained more fully hereinbelow); (5) Binary Object LRC 68 (explained more fully hereinbelow); (6) Binary Object Hash 70 (explained more fully hereinbelow); and (7) Binary Object Offset 72 (explained more fully hereinbelow). The Binary Object Size 64, Binary Object CRC32 66, Binary Object LRC 68 and Binary Object Hash 70 comprise the Binary Object Identifier 74 which is a unique identifier for each binary object to be backed up and is discussed in more detail below.

Figure 4:
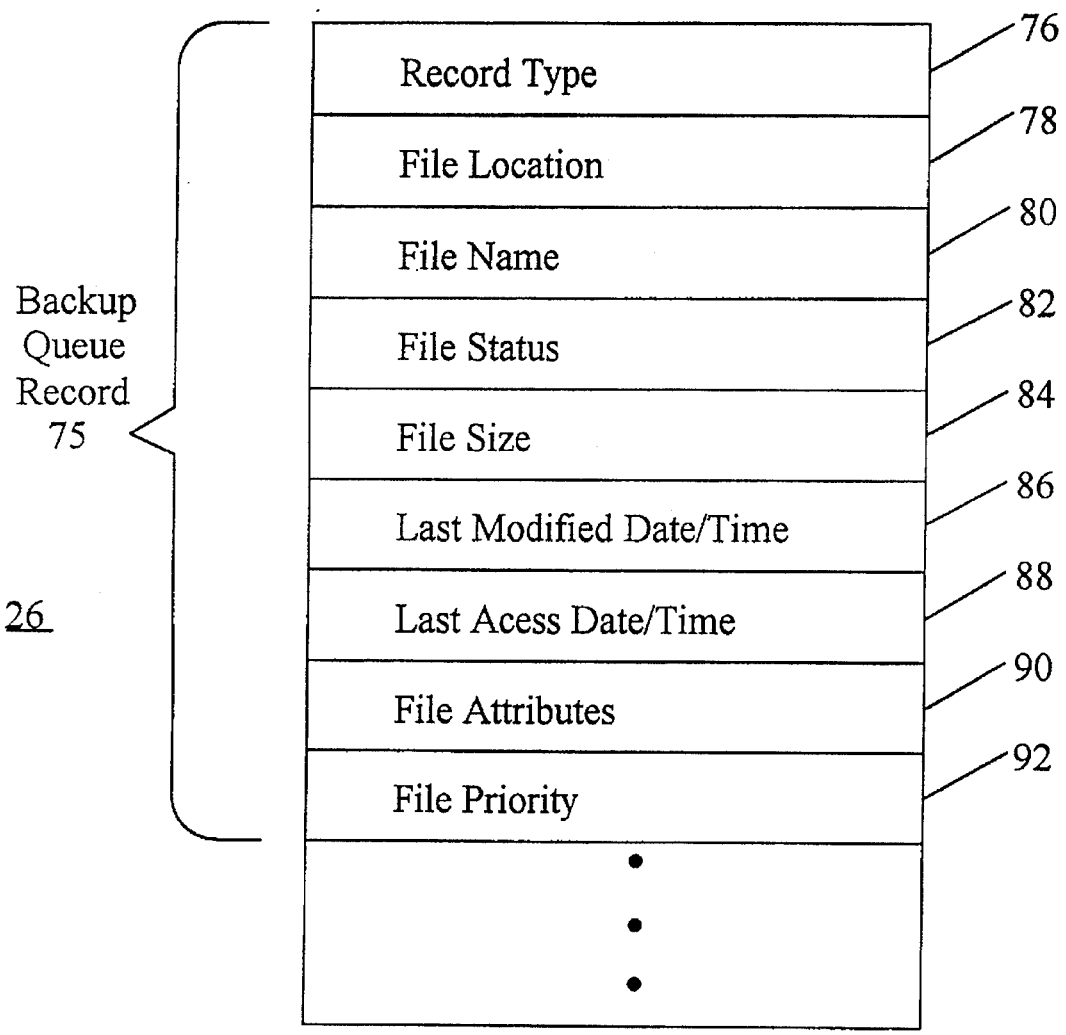
FIG. 4 illustrates the Backup Queue Database utilized by the Distributed Storage Manager program of the present invention.

The Distributed Storage Manager program 24 also builds and maintains the Backup Queue Database 26 on one of the disk drives 19 on each local computer 20 in the networked computer system 10 according to the structure illustrated in FIG. 4. Each entry (Backup Queue Record 75) in the Backup Queue Database 26 is comprised of the following components: (1) Record Type 76 (identifies the file as either a directory file or a regular file); (2) File Location 78 (name of the directory in which the file resides); (3) File Name 80 (name of the file); (4) File Status 82 ("new", "modified" or "deleted"); (5) File Size 84; (6) Last Modified Date/Time 86; (7) Last Access Date/Time 88; (8) File Attributes 90 (e.g., read-only, system, hidden); and (9) File Priority 92 (explained more fully hereinbelow).

The operation of the Distributed Storage Manager program 24 may be illustrated by way of the flow charts depicted in FIGS. 5a through 5l. For explanation purposes, the Distributed Storage Manager program 24 is divided into several distinct functions which will be discussed in turn. Those of ordinary skill in the art will recognize, however, that each of the distinct functions operates in cooperation with the other functions to form a unitary computer program. Those of ordinary skill in the art will also recognize that the following discussion illustrates the operation of the Distributed Storage Manager program 24 on a single local computer 20, although it should be understood that the Distributed Storage Manager program 24 operates in the same fashion on each local computer 20 on the networked computer system 10. The Distributed Storage Manager program 24 can either be executed on user demand or can be set to execute periodically on a user-defined schedule.

1. Identification of Binary Objects to be Backed Up

Figure 5A:
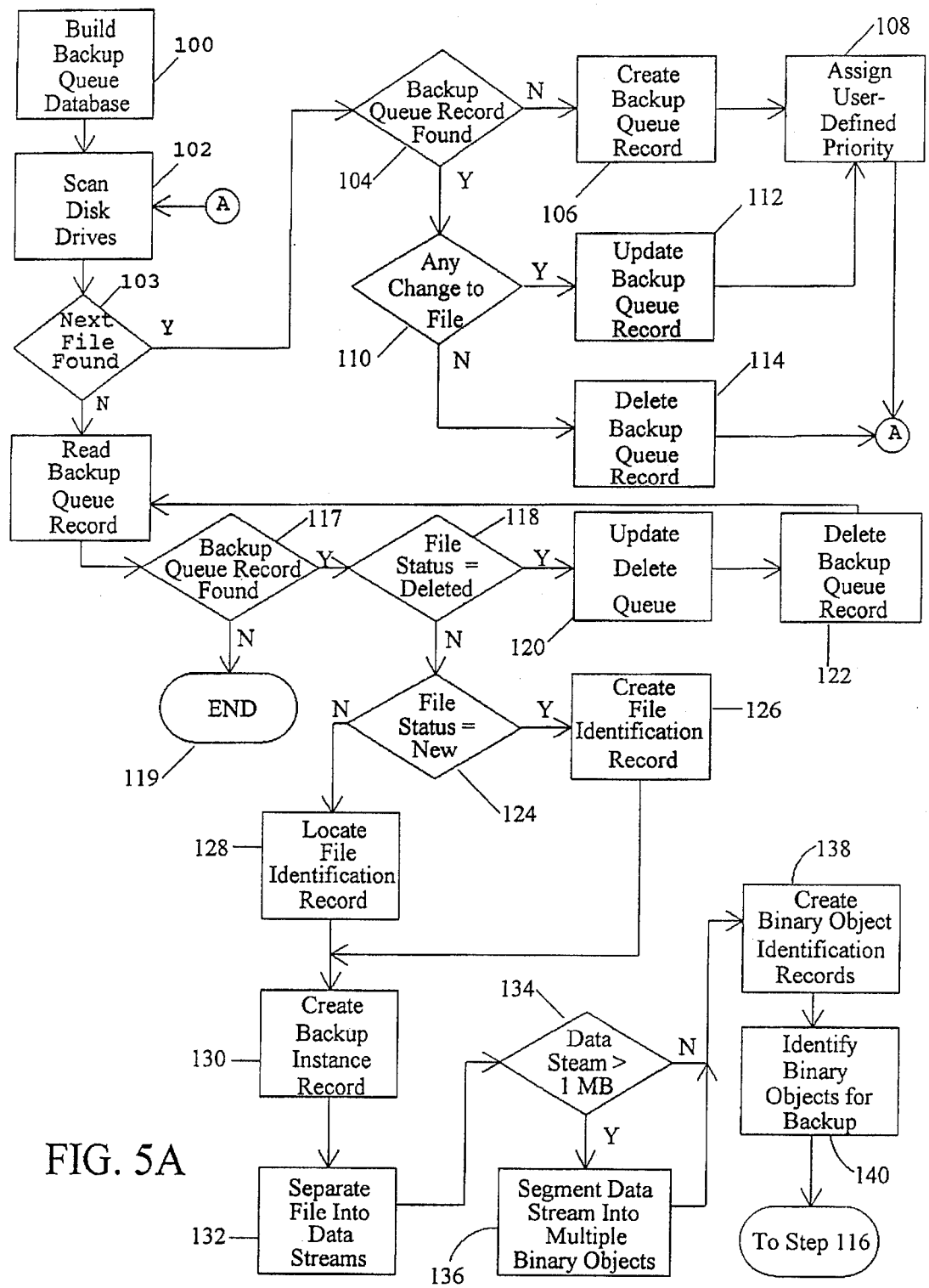
FIGS. 5a–5l illustrate flow charts explaining the operation of the Distributed Storage Manager program of the present invention.

In the flow chart of FIG. 5a, execution of the Distributed Storage Manager program 24 begins at step 100 where the Backup Queue Database 26 is built by creating a Backup Queue Record 75 for each File Identification Record 34 found in File Database 25. In this way, a list of files that were backed up during the previous backup cycle is established so that it can be determined which files need to be backed up during the current backup cycle. To create each Backup Queue Record 75, the Backup Instance Record 42 representing the most recent backup of the file represented by each File Identification Record 34 is located. This determination is made by examining the Backup Cycle Identifier 46 in each Backup Instance Record 42. The Backup Cycle Identifier 46 may represent either a date (month/day/year) or numerical value assigned to a particular backup cycle. The Backup Queue Record 75 is comprised of certain of the data fields of both the File Identification Record 34 and the Backup Instance Record 42. During the process of creating each Backup Queue Record 75, the File Status field 82 is set to "DELETED". However, if the Delete Date field 56 of the most recent Backup Instance Record 42 associated with the File Identification Record 34 currently being processed is non-zero, indicating that the file has been previously deleted, then no Backup Queue Record 75 is created for that File Identification Record 34. If the backup that is currently being processed for the local computer 20 is not a full backup (i.e., all files on all disk drives 19 on the local computer 20), then the Distributed Storage Manager program 24 will only create Backup Queue Records 75 for those files that match the backup specifications. For example, if only those files that have a file extension of ".EXE" are to be backed up, then only File Identification Records 34 that correspond to ".EXE" files will be processed.

Program control then continues with step 102 where the Distributed Storage Manager program 24 of the present invention scans all disk drives 19 on the local computer 20 that are to be backed up. This operation consists of scanning the directory hierarchy on each disk drive 19 on the local computer 20 and returning to the Distributed Storage Manager program 24 certain file block information for each of the directory files and regular files that are stored on the disk drives 19 to be backed up. A typical computer operating system maintains a file block for each file stored on the system which includes information such as file location, file type, user-assigned file name, file size, creation date and time, modify date and time, access date and time and file attributes. This operation may be controlled by some parameters that indicate which drives, directories and files are to be backed up during a backup operation. However, the default operation is to back up all files on all disk drives 19 on the local computer 20. Program control then continues with step 103 where the Distributed Storage Manager program 24 determines whether the file block information for an additional file has been located on the disk drives 19. If an additional file has been located, program control continues with step 104. If an additional file has not been located, program control continues with step 116.

In step 104, the Distributed Storage Manager program 24 determines whether a Backup Queue Record 75 exists for the located file by comparing the file's file block information to the information stored in Backup Queue Database 26. If such a Backup Queue Record 75 does not exist (i.e., this is the first time this file will be backed up), program control continues with step 106 where a Backup Queue Record 75 for the file is created using the information contained within the file's file block. The File Status field 82 for the newly created Backup Queue Record 75 is set to "NEW". Program control then continues with step 108 where a user-defined priority is assigned to the file and stored in the File Priority field 92 of the Backup Queue Record 75. This user-defined priority may be assigned to the file by methods that are well-known to those of ordinary skill in the art. The use of the File Priority field 92 by the Distributed Storage Manager program 24 is discussed in more detail hereinbelow. Program control is then returned to step 102.

If the Distributed Storage Manager program 24 determines, in step 104, that a Backup Queue Record 75 exists in the Backup Queue Database 26 for the located file, program control continues with step 110 where it is determined whether any change has been made to the file. This determination is made by comparing the information in the file's file block with the information stored in the file's Backup Queue Record 75. If any of the values have changed, program control continues with step 112 where File Status field 82 is set to "MODIFIED" and the fields in the Backup Queue Record 75 are updated from the file's file block information. Program control then continues with step 108 where a user-defined priority is assigned to the file and stored in File Priority field 92; program control is then returned to step 102. If the determination is made in step 110 that no change has been made to the file, then, in step 114, the Backup Queue Record 75 is deleted from the Backup Queue Database 26 since the file does not need to be backed up. Following step 114, program control is returned to step 102.

If the Distributed Storage Manager program 24 determines, in step 103, that an additional file has not been located, program control continues with step 116. In step 116, the Distributed Storage Manager program 24 reads each Backup Queue Record 75 in Backup Queue Database 26, one at a time. The Backup Queue Records 75 in Backup Queue Database 26 represent all of the files that must be backed up by the Distributed Storage Manager program 24 during the present backup cycle. Program control continues with step 117 where the Distributed Storage Manager program 24 determines whether a next Backup Queue Record 75 has been located in Backup Queue Database 26. If a next Backup Queue Record 75 has been located, program control continues with step 118; otherwise, program control continues with step 119, where the routine illustrated by the flow chart of FIG. 5a is terminated. In step 118, the Distributed Storage Manager program 24 determines whether the File Status field 82 in the Backup Queue Record 75 currently being processed is set to "DELETED". If the File Status field 82 is set to "DELETED", program control continues with step 120 where the Delete Date field 56 in the most recent Backup Instance Record 42 associated with the file identified by the Backup Queue Record 75 currently being processed is set to the current date. A list of all Binary Object Identification Records 58 associated with the Backup Instance Record 42 for the file identified by the Backup Queue Record 75 currently being processed is placed in a delete queue (not shown) that will be used by Distributed Storage Manager program 24 to delete all Binary Object Identification Records 58 for binary objects that have been deleted from the disk drives 19 of local computer 20. Program control then continues with step 122 where the Backup Queue Record 75 currently being processed is deleted from the Backup Queue Database 26. Program control is then returned to step 116.

If the Distributed Storage Manager program 24 determines, in step 118, that the File Status field 82 of the Backup Queue Record 75 currently being processed is not set to "DELETED", program control continues with step 124 where the Distributed Storage Manager program 24 determines whether the File Status field 82 of the Backup Queue Record 75 currently being processed is set to "NEW". If the File Status field 82 is set to "NEW", program control continues with step 126 where a File Identification Record 34 is created in File Database 25 using the information stored in the Backup Queue Record 75 currently being processed. Program control then continues with step 130. If the Distributed Storage Manager program 24 determines, in step 124, that the File Status field 82 of the Backup Queue Record 75 currently being processed is not set to "NEW" (i.e., the file has been modified since the last backup cycle), program control continues with step 128 where the File Identification Record 34 associated with the file identified by the Backup Queue Record 75 currently being processed is located in the File Database 25. Program control then continues with step 130. In step 130, the Distributed Storage Manager program 24 creates a new Backup Instance Record 42 in the File Database 25 for the file identified by the Backup Queue Record 75 currently being processed. The Backup Instance Record 42 is created using information stored in the associated File Identification Record 34 and the Backup Queue Record 75 currently being processed. The Backup Cycle Identifier 46 is set to indicate that the file is to be backed up during the current backup cycle. The Delete Date field 56 is initialized to "zero". The Insert Date field 57 is set to the current date.

Program control then continues with step 132 where the Distributed Storage Manager program 24 separates the file identified by the Backup Queue Record 75 currently being processed into its component data streams. Each data stream is then processed individually. Those of ordinary skill in the art will recognize that these data streams may represent regular data, extended attribute data, access control list data, etc. Program control continues with step 134 where the Distributed Storage Manager program 24 determines whether each of the data streams currently being processed is larger than the maximum binary object size (currently one (1) megabyte). If the data stream is larger than one (1) megabyte, program control continues with step 136 where the data stream currently being processed is segmented into multiple binary objects smaller in size than one (1) megabyte. Either following step 136 or, if the determination is made in step 134 that the data stream currently being processed is not larger than one (1) megabyte (and, thus, the data stream is represented by a single binary object), program control continues with step 138.

In step 138, a Binary Object Identification Record 58 is created in File Database 25 for each of the binary objects currently being processed. Each of these Binary Object Identification Records 58 are associated with the Backup Instance Record 42 created in step 130. The Binary Object Identifier 74 portion of each Binary Object Identification Record 58 is comprised of the Binary Object Size field 64, the Binary Object CRC32 field 66, the Binary Object LRC field 68 and the Binary Object Hash field 70. Each of the fields of the Binary Object Identifier 74 may be four (4) bytes in length and is calculated from the contents of each binary object. The Binary Object Size field 64 may be set equal to the byte-size of the binary object. The Binary Object CRC32 field 66 may be set equal to the standard 32-bit Cyclical Redundancy Check number calculated against the contents of the binary object taken one (1) byte (8 bits) at a time. Those of ordinary skill in the art will readily recognize the manner in which the Cyclical Redundancy Check number is calculated. The Binary Object LRC field 68 may be set equal to the standard Longitudinal Redundancy Check number calculated against the contents of the binary object taken four (4) bytes (32 bits) at a time using the following algorithm:

```
BINARY OBJECT LRC = (initialized value)
for each double word (32 bits) of the binary object data:
    LRC = LRC (XOR) double word of binary object data
end loop
```

The Binary Object Hash field 70 is calculated against the contents of the binary object taken one (1) word (16 bits) at a time using the following algorithm:

```
HASH = (initialized value)
for each word (16 bits) of the binary object:
    rotate current HASH value by 5 bits
    HASH = HASH + 1
    HASH = HASH + (current word (16 bits) of binary object)
end loop
```

Since the Binary Object Identifier 74 is used to uniquely identify a particular binary object, it is important that the possibility of two different binary objects being assigned the same Binary Object Identifier 74 be very small. This is the reason for implementing the Binary Object Identifier 74 using 128 bits and four separate calculations. Although a Binary Object Identifier 74 may be calculated in various ways, the key notion is that the Binary Object Identifier is calculated from the contents of the data instead of from an external and arbitrary source. By incorporating the Binary Object Size field 64 within the Binary Object Identifier 74, only binary objects that are exactly the same size can generate duplicate Binary Object Identifiers 74. Further, the calculations used to determine the Binary Object CRC32 field 66, the Binary Object LRC field 68 and the Binary Object Hash field 70 are relatively independent of each other. Using the calculations set forth above, the probability that the Distributed Storage Manager program 24 will generate the same Binary Object Identifier 74 for two different binary objects is extremely low. Those of ordinary skill in the art will recognize that there exist many different ways of establishing the Binary Object Identifier 74 (e.g., establishing a Binary Object Identifier 74 of a different length or utilizing different calculations) and that the procedure set forth above is only one way of establishing the Binary Object Identifier 74. The critical feature to be recognized in creating a Binary Object Identifier 74 is that the identifier should be based on the contents of the binary object so that the Binary Object Identifier 74 changes when the contents of the binary object changes. In this way, duplicate binary objects, even if resident on different types of computers in a heterogeneous network, can be recognized from their identical Binary Object Identifiers 74.

Program control then continues with step 140 where the Distributed Storage Manager program 24 identifies which binary objects must be backed up during the current backup cycle. If the File Status field 82 of the Backup Queue Record 75 currently being processed is set to "NEW", then all binary objects associated with the file identified by the Backup Queue Record 75 currently being processed must be backed up during the current backup cycle. If the File Status field 82 is set to "MODIFIED", then only those binary objects associated with the file that have changed must be backed up. Those binary objects that have changed are identified by comparing the Binary Object Identifiers 74 calculated in step 138 with the corresponding Binary Object Identifiers 74 associated with the next most recent Backup Instance Record 42 for the file identified by the Backup Queue Record 75 currently being processed. The Binary Object Identifiers 74 calculated in step 138 are compared against their counterparts in the File Database 25 (e.g., the Binary Object Identifier 74 (as calculated in step 138) that identifies the first binary object in the file (as determined by the Binary Object Stream Type field 62 and the Binary Object Offset field 72) is compared to the Binary Object Identifier 74 (associated with the next most recent Backup Instance Record 42) for the first binary object in the file). This procedure allows the Distributed Storage Manager program 24 to determine which parts of a file have changed and only back up the changed data instead of backing up all of the data associated with a file when only a small portion of the file has been modified. Program control is then returned to step 116.

2. Concurrent Onsite/Offsite Backup

The Distributed Storage Manager program 24 performs two concurrent backup operations. In most cases, the Distributed Storage Manager program 24 stores a compressed copy of every binary object it would need to restore every disk drive 19 on every local computer 20 somewhere on the local area network 16 other than on the local computer 20 on which it normally resides. At the same time, the Distributed Storage Manager program 24 transmits every new or changed binary object to the remote backup file server 12. Binary objects that are available in compressed form on the local area network 16 can be restored very quickly while the much greater storage capacity on the remote backup file server 12 ensures that at least one copy of every binary object is stored and that a disaster that destroys an entire site would not destroy all copies of that site's data.

Figure 5B:
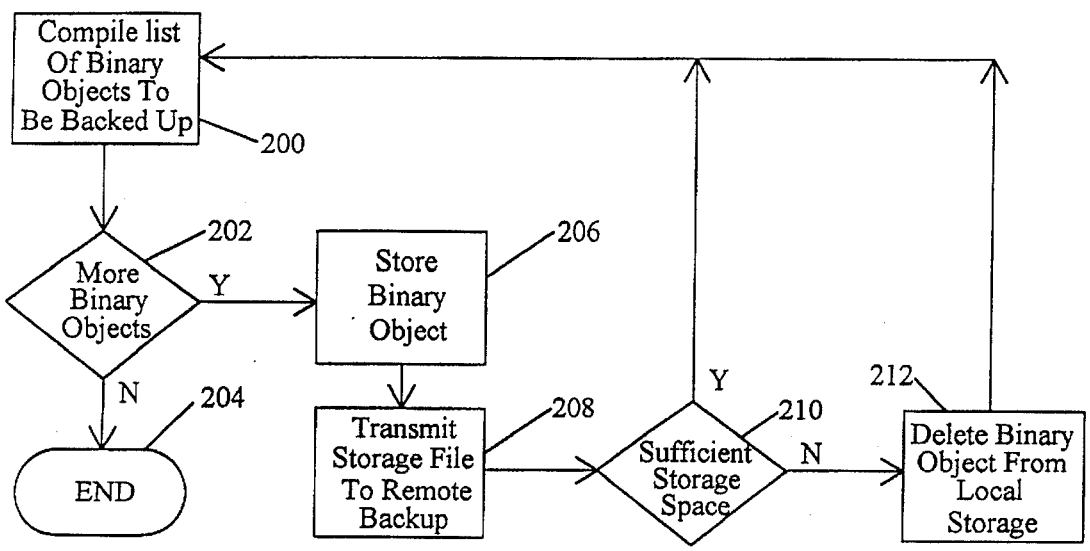

The Concurrent Onsite/Offsite Backup routine begins at step 200 of the flow chart illustrated in FIG. 5b where the Distributed Storage Manager program 24 compiles a list of those binary objects that are to be backed up during the current backup cycle. Those binary objects which must be backed up during the current backup cycle are identified in step 140 of the flow chart of FIG. 5a. Those of ordinary skill in the art will recognize, however, that the Concurrent Onsite/Offsite Backup routine may be performed independently of the routine illustrated in FIG. 5a. Program control then continues with step 202 where the Distributed Storage Manager program 24 identifies whether there are any additional binary objects to be processed. If no additional binary objects are to be processed, program control is transferred to step 204 where the Concurrent Onsite/Offsite Backup routine is terminated. Otherwise, program control continues with step 206 where the binary object currently being processed is compressed and stored in a compressed storage file 32 (FIG. 2) on one of the disk drives 19 on a local computer 20 on the local area network 16 other than the local computer 20 on which the binary object is currently stored. The compressed storage file 32 is used to allow the Distributed Storage Manager program 24 to pack several smaller compressed binary objects into a larger unit for storage. This is required to reduce the number of files that the Distributed Storage Manager program 24 must manage and to ensure that the Distributed Storage Manager program 24 does not create many "small" files since most file systems allocate some minimum amount of space to store a file even if the actual file contains less data than the allocated space. The purpose behind storing the backup copy of a binary object on a disk drive 19 on a different local computer 20 is to ensure that if the first disk drive 19 or local computer 20 fails, the backup copies of the binary objects are not lost along with the original copies of the binary objects.

Program control then continues with step 208 where each compressed storage file 32, when it reaches a maximum manageable size (e.g., two (2) megabytes), is transmitted to the remote backup file server 12 (FIG. 1) over wide area network 14 for long-term storage and retrieval. Upon arrival of the compressed storage file 32 at the remote backup file server 12, software resident on the remote backup file server 12 routes the compressed storage file 32 for ultimate storage to magnetic tape or other low cost storage media. The backup copy of a binary object which is maintained in the compressed storage file 32 on one of the disk drives 19 on one of the local computers 20 is only the most recent version of each binary object that is backed up while the backup copy of the binary object stored on the remote backup file server 12 is kept until it is no longer needed. Since most restores of files on a local area network 16 consist of requests to restore the most recent backup version of a file, the local copies of binary objects serve to handle very fast restores for most restore requests that occur on the local area network 16. If the local backup copy of a file does not exist or a prior version of a file is required, it must be restored from the remote backup file server 12. Program control then continues with step 210 where the Distributed Storage Manager program 24 determines whether sufficient space is available in the space allocated for compressed storage files 32 on the disk drives 19 on local computers 20 for storage of the binary object currently being processed. If sufficient space is available, program control is returned to step 200. Otherwise, the binary object currently being processed is deleted from the disk drive 19 on which it was stored after transmission to the remote backup file server 12 has been completed. Program control is then returned to step 200.

3. File Prioritization

The file prioritization process performed by the Distributed Manager Storage program 24 is handled by four interrelated routines of that program: (1) Backup/Restore Routine; (2) Compression Routine; (3) Local Storage Routine; and (4) Resource Allocation Routine. Each routine will be described in turn. In the following discussion, when one of the four routines is discussed, it should be understood that it is the Distributed Storage Manager program 24 that is executing the functions of that routine. The Backup/Restore Routine, the Local Storage Routine and the Compression Routine may be executed on each of the local computers 20 on the networked computer system 10 while the Resource Allocation Routine is executed on only one of the local computers 20 on the networked computer system 10. This execution scheme permits the resources of any available local computer 20 on any of the local area networks 16 to be utilized according to its availability. Furthermore, more than one local computer 20 may be utilized to complete any high-priority tasks required to be completed within a specified time frame. An advantage of the process of prioritization of files is that it allows the Distributed Storage Manager program 24 to effectively deal with a situation where local storage and wide area network transmission resources are limited. The Distributed Storage Manager program 24 is also able to keep track of data which is not stored locally or transmitted to the remote backup file server 12 in any given backup cycle and then attempt to resume these processes during the next backup cycle.

Figure 5C:
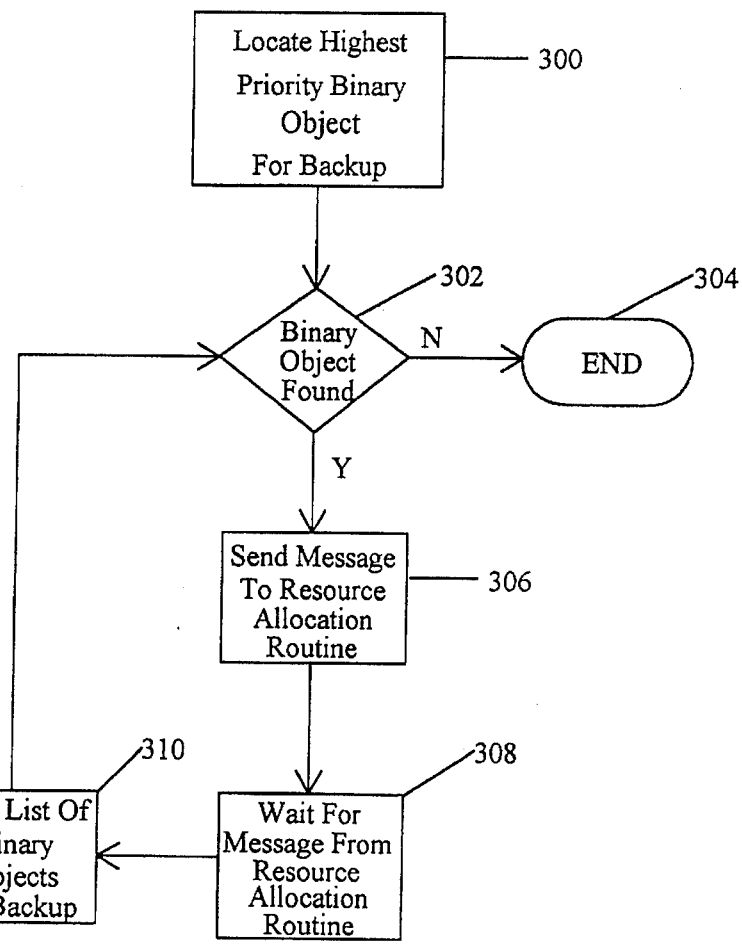

The Backup/Restore Routine is illustrated in the flow chart shown in FIG. 5c. In step 300, the Distributed Storage Manager program 24 initiates the Backup/Restore Routine by locating the highest priority binary object scheduled for backup on the local computer 20 on which the Backup/Restore Routine is executing. The identities of the binary objects to be backed up and their respective priorities were determined by the Distributed Storage Manager program 24 in the flow chart of FIG. 5a. Those of ordinary skill in the art will recognize, however, that the file prioritization routines of the Distributed Storage Manager program 24 may be utilized independently of the process illustrated in the flow chart of FIG. 5a. Program control then continues with step 302 where the Backup/Restore Routine of the Distributed Storage Manager program 24 determines whether a binary object to be backed up has been located. If not, program control continues with step 304 where the Backup/Restore Routine is terminated. Otherwise, program control continues with step 306 where the Backup/Restore Routine of the Distributed Storage Manager program 24 sends a message to the Resource Allocation Routine indicating the priority of the highest priority binary object that the Backup/Restore Routine has located. Program control then continues with step 308 where the Backup/Restore Routine waits for a message from the Resource Allocation Routine indicating which Compression Routine is available to compress and store the highest priority binary object located by the Backup/Restore Routine. In this way, the Distributed Storage Manager program 24 is able to perform not only local computer 20 based file prioritization but also networked computer system 10 based file prioritization. This is accomplished by having the Resource Allocation Routine examine the priority of the highest priority binary object located by each Backup/Restore Routine and then allocating compression resources to the Backup/Restore Routine which has the highest priority binary object to compress.

Program control continues with step 310 where the Backup/Restore Routine receives a message from the Resource Allocation Routine indicating that a Compression Routine is available for binary object compression. The Backup/Restore Routine then sends a list of up to forty (40) binary objects or up to one (1) megabyte of uncompressed binary objects to the Compression Routine starting with the highest priority binary object that the Backup/Restore routine has identified for backup. The reason to limit the number or size of binary objects that are sent to a Compression Routine is to allow the Compression Routine to work for a limited amount of time on the binary objects for one Backup/Restore Routine before becoming available to work on another Backup/Restore Routine's binary objects.

Figure 5D:
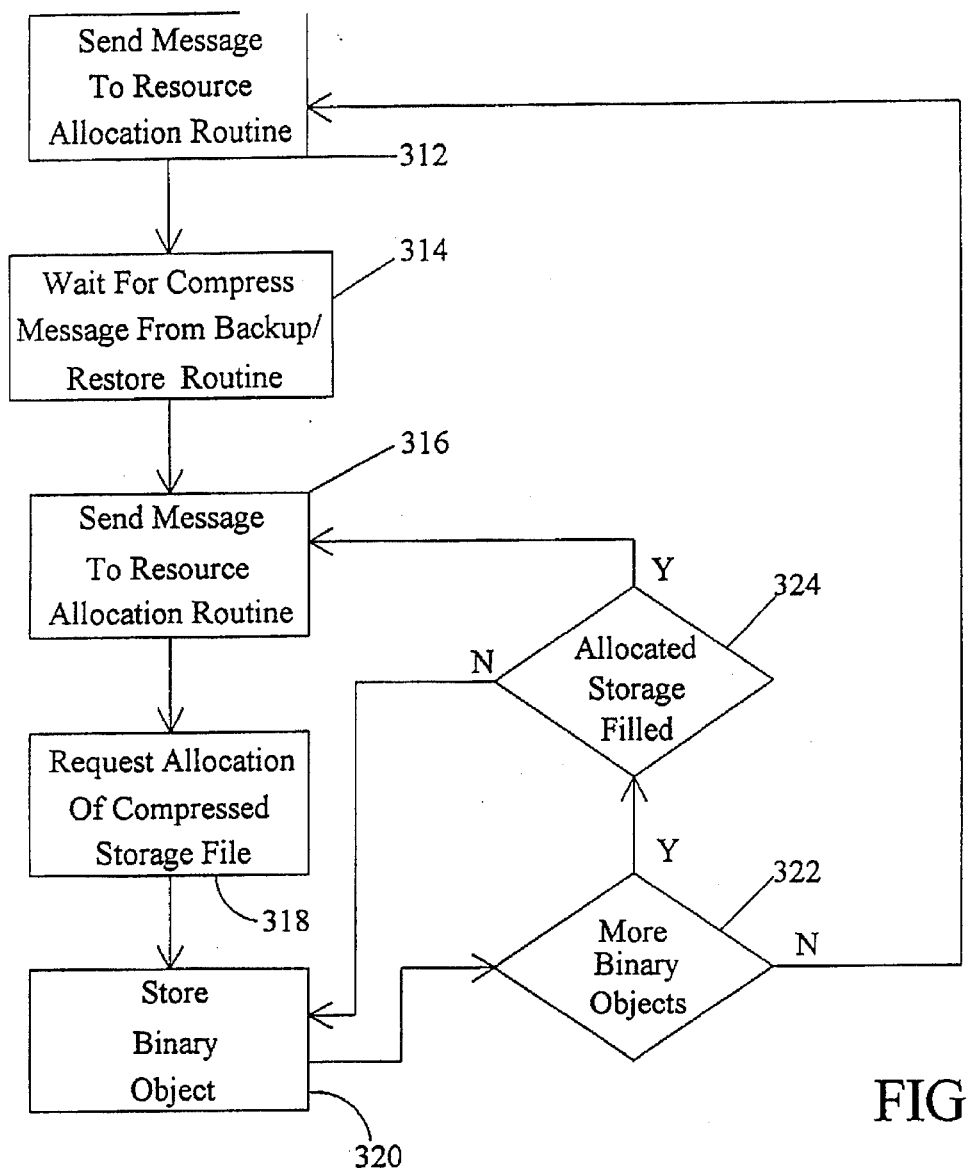

The Compression Routine performed by the Distributed Storage Manager program 24 is illustrated in the flow chart depicted in FIG. 5d. Program control begins at step 312 where the Compression Routine of the Distributed Storage Manager program 24 sends a message to the Resource Allocation routine indicating that the Compression Routine is available to compress binary objects. Program control then continues with step 314 where the Compression Routine waits for a compress message from a Backup/Restore Routine indicating which binary objects are to be compressed. The compress message includes the File Name 40 from Identification Record 34, the Binary Object Stream Type field 62 from the Binary Object Identification Record 58 and the Binary Object Offset field 72 from the Binary Object Identification Record 58 for each binary object to be compressed. The binary objects are placed in a compression queue (not shown) for processing by the Compression Routine. Program control then continues with step 316 where the Compression Routine sends a message to the Resource Allocation Routine to determine which Local Storage Routine has space available for storage of compressed binary objects. Program control then continues with step 318 where the Compression Routine requests allocation of a compressed storage file 32 from the Local Storage Routine that has indicated availability of storage space. Program control continues with step 320 where the binary object is compressed and stored in the allocated compressed storage file 32. Program control then continues with step 322 where the Compression Routine determines whether there are more binary objects in the compress queue. If there are no more binary objects present in the compress queue, program control returns to step 312. If more binary objects are present, program control continues with step 324 where the Compression Routine determines whether the allocated compressed storage file 32 is full. If not, program control is returned to step 320. Otherwise, program control is returned to step 316 where the Compression Routine sends a message to the Resource Allocation Routine to determine which Local Storage Routine has space available for storage of compressed binary objects.

Figure 5E:
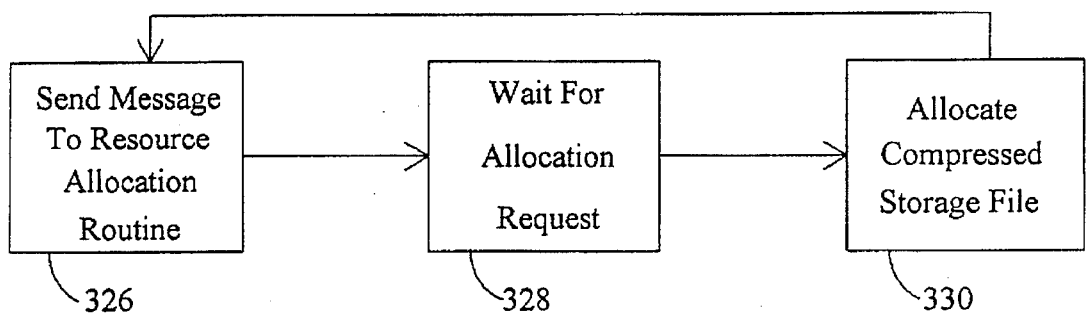

The Local Storage Routine executed by the Distributed Storage Manager program 24 is illustrated in the flow chart depicted in FIG. 5e. The Local Storage Routine is responsible for managing storage file space on a particular local computer 20. Program control beings at step 326 where the Local Storage Routine of Distributed Storage Manager program 24 sends a message to the Resource Allocation Routine indicating the amount of storage space it has available for allocation of compressed storage files 32. The Local Storage Routine determines the amount of space it has available for allocation of compressed storage files 32 by determining the total amount of free space on its disk drives 19 and then determining how must space must be left as "free space". The amount of required "free space" is user-specified. Program control continues with step 328 where the Local Storage Routine waits for a request from a Compression Routine for allocation of a compressed storage file 32. Upon receipt of such a request, program control continues with step 330 where the requested compressed storage file 32 (e.g., two (2) megabytes in size) is allocated. The Local Storage Routine then returns a message to the requesting Compression Routine indicating the name and location of the compressed storage file 32 that has been allocated. Program control is then returned to step 326.

Figure 5F:
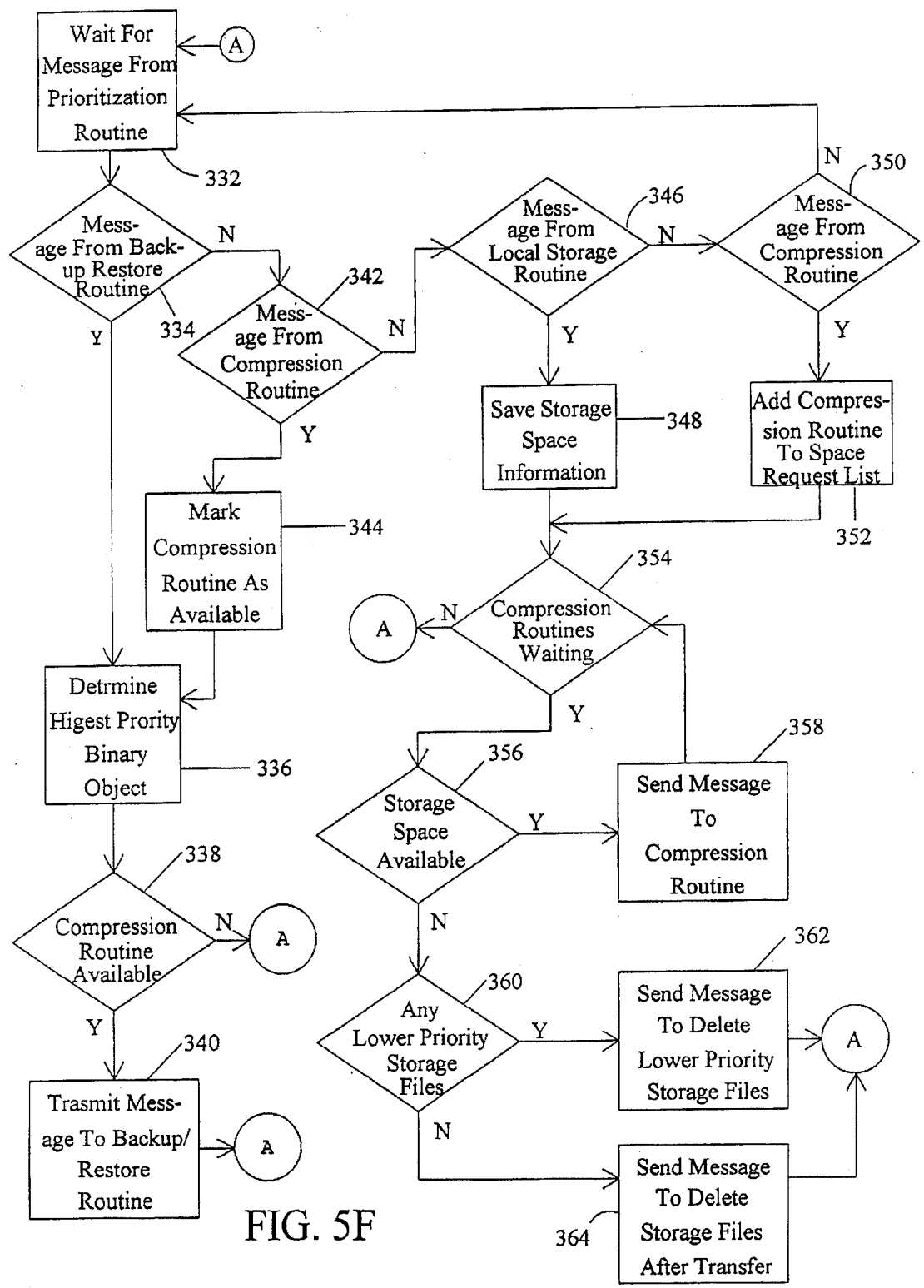

The Resource Allocation Routine performed by the Distributed Storage Manager program 24 of the present invention is depicted in the flow chart of FIG. 5f. The Resource Allocation Routine is a process that responds to messages from other routines of the Distributed Storage Manager program 24 and allocates resources between resource requesters and resource providers. Program control begins with step 332 where the Resource Allocation Routine executed by the Distributed Storage Manager program 24 waits for a message from a Distributed Storage Manager program 24 routine. When a message is received, program control continues with step 334 where the Resource Allocation Routine determines whether the message is from a Backup/Restore Routine transmitting information relating to its highest priority binary object for compression. If such a message is received, program control continues with step 336 where the Resource Allocation Routine stores this information in an internal table containing Backup/Restore Routine status information. The Resource Allocation Routine then scans this status information table to ascertain which Backup/Restore Routine has the highest priority binary object for storage. Program control then continues with step 338 where the Resource Allocation Routine determines whether any Compression Routine is available to process the highest priority binary object. If no Compression Routine is available for processing, program control is returned to step 332. If an available Compression Routine is located, program control continues with step 340 where the Resource Allocation Routine transmits a message to the requesting Backup/Restore Routine indicating which Compression Routine is available to compress the binary object. In addition, the Resource Allocation Routine marks the Compression Routine as "working" in an internal table containing Compression Routine information. Program control is then returned to step 332.

If the Resource Allocation Routine determines, in step 334, that the received message is not from a Backup/Restore Routine, program control continues with step 342 where the Resource Allocation Routine determines whether the received message is from a Compression Routine indicating that the transmitting Compression Routine is available for processing. If the received message is from a Compression Routine, program control continues with step 344 where the Resource Allocation Routine marks the transmitting Compression Routine as "available" in its internal table containing Compression Routine information. Program control then continues with step 336.

If the Resource Allocation Routine determines, in step 342, that the received message has not been transmitted from a Compression Routine indicating its availability for processing, program control continues with step 346 where the Resource Allocation Routine determines whether the received message is from a Local Storage Routine indicating the amount of storage space that the Local Storage Routine has available. If the received message is from a Local Storage Routine, Program control continues with step 348 where the Resource Allocation Routine locates the transmitting Local Storage Routine in an internal table containing Local Storage Routine information and saves the storage space information transmitted by the Local Storage Routine. Program control then continues with step 354. If the Resource Allocation Routine determines, in step 346, that the received message is not from a Local Storage Routine, program control continues with step 350 where the Resource Allocation Routine determines whether the received message is from a Compression Routine requesting a compressed storage file 32. If the Resource Allocation Routine determines that such a message was received, program control continues with step 352 where the identity of the requesting Compression Routine is added to a "space request list". Program control then continues with step 354. If the Resource Allocation Routine determines, in step 350, that the received message is not from a Compression Routine requesting a compressed storage file 32, program control is returned to step 332.

In step 354, the Resource Allocation Routine determines whether any Compression Routines are waiting for allocation of a compressed storage file 32 by examining the "space request list". If no such Compression Routines are in the "space request list", program control is returned to step 332. If the identity of such a Compression Routine is found in the "space request list", program control continues with step 356 where the Resource Allocation Routine determines whether any of the Local Storage Processors has any available space by examining the information in its internal table containing Local Storage Routine information. When a Compression Routine requests a compressed storage file 32, the Compression Routine identifies the name of the local computer 20 on which the Backup/Restore Routine is executing and on whose behalf it is compressing binary objects. This allows the Compression Routine to request a compressed storage file 32 on a local computer 20 other than the local computer 20 on which the binary object to be stored resides. Otherwise, the backup copy of the binary object may be stored on the same local computer 20 as the original binary object whereby a disk drive failure would result in losing both the original and backup copies. The Resource Allocation Routine uses the information supplied by the Compression Routine to ensure that the requested compressed storage file 32 is allocated on a local computer 20 other than the local computer 20 from which the binary object originated. If available storage space is located, program control continues with step 358 where the Resource Allocation Routine transmits a message to the next Compression Routine in the "space request list" indicating which Local Storage Routine has allocated an available compressed storage file 32. Program control is then returned to step 354.

If the Resource Allocation Routine determines, in step 356, that no storage space is available, program control continues with step 360 where the Resource Allocation Routine determines whether there are any compressed storage files 32 that are maintained by any of the Local Storage Routines which have a lower priority that the binary object currently being processed. If so, program control continues with step 362 where a message is transmitted to the Local Storage Routines instructing the Local Storage Routines to delete some of the low-priority compressed storage files 32 to make room for higher priority binary objects. After these lower-priority compressed storage files 32 are deleted by the Local Storage Routines, the Local Storage Routines will transmit new status messages to the Resource Allocation Routine. Program control is then returned to step 332. If no lower-priority compressed storage files 32 are located in step 360, program control continues with step 364 where the Resource Allocation Routine transmits a message to the Local Storage Routines with instructions that from that time forward, any allocated compressed storage files 32 are to be deleted after the contents of the compressed storage files 32 have been successfully transmitted to the remote backup file server 12 for long-term storage. Program control is then returned to step 332.

4. Granularization of Files

The most important class of "large" files on computer systems such as networked computer system 10 is databases. Typically, on a given day, only a small percentage of the data in a large database is changed by the users of that database. However, it is likely that some data will be changed in each one of the (1) megabyte binary object segments that are created in step 136 of the flow chart depicted in FIG. 5a. As a result, in most cases, the entire "large" database file would have to be backed up to the remote backup file server 12. However, the Distributed Storage Manager program 24 of the present invention utilizes a technique of subdividing large database files into "granules" and then tracks changes from the previous backup copy at the "granule" level. The "granule" size utilized by the Distributed Storage Manager program 24 may be one (1) kilobyte although those of ordinary skill in the art will recognize that any "granule" size that produces the most efficient results (in terms of processing time and amount of data that must be backed up) may be utilized. This technique of subdividing files into "granules" is only used to reduce the amount of data that must be transmitted to the remote backup file server 12 and is not utilized in making backup copies of binary objects for storage on local computers 20.

Figure 5G:
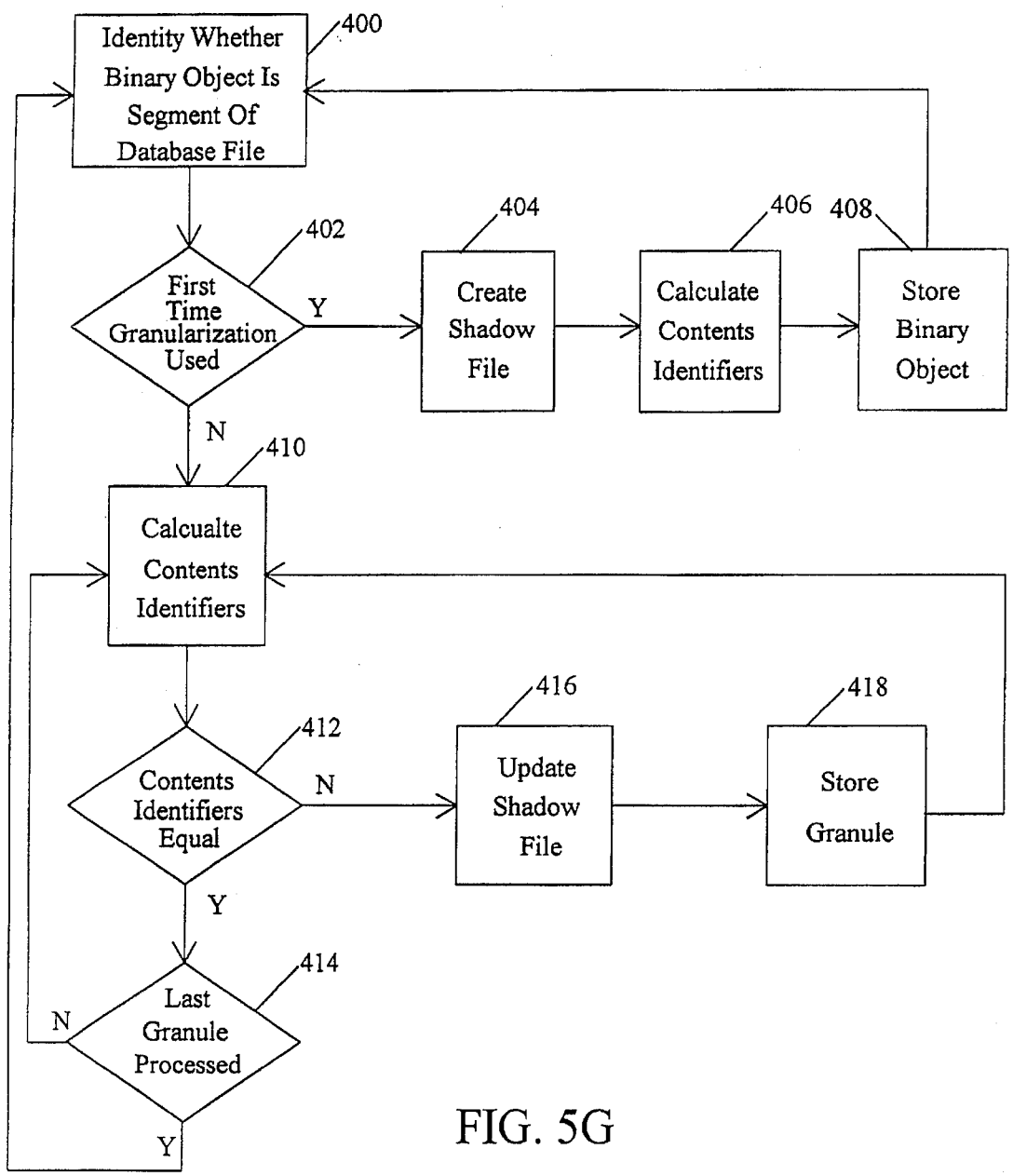

The operation of the Distributed Storage Manager program 24 in subdividing files into "granules" is illustrated in the flow chart depicted in FIG. 5g. This "granularization" procedure is performed for "large" files following step 136 of the flow chart of FIG. 5a. Program control begins at step 400 where the Distributed Storage Manager program 24 identifies whether the binary object currently being processed is a segment of a "large" database-like file. Program control then continues with step 402 where the Distributed Storage Manager program 24 determines whether this is the first time that the binary object currently being processed is being backed up using the "granularization" technique. If so, program control continues with step 404 where the Distributed Storage Manager program 24 creates a "shadow file" which contains a "contents identifier" for each "granule" in the binary object currently being processed. Each "contents identifier" is composed of a standard 32-bit Cyclical Redundancy Check number which is calculated against the contents of the "granule" and a 32-bit hash number which is calculated against the contents of the "granule" in the same manner described in relation to step 138 of the flow chart depicted in FIG. 5a. Those of ordinary skill in the art will readily recognize the manner in which the Cyclical Redundancy Check number is calculated. Each time that the binary object is to be backed up, the Distributed Storage Manager program 24 can calculate the "contents identifier" for each "granule" in the binary object and then compare it to the "contents identifier" of the "granule" the last time the binary object was backed up and determine if the "granule" has changed. This allows the Distributed Storage Manager program 24 to determine what data within a binary object has changed and only back up the changed data instead of the entire binary object. Program control then continues with step 406 where the Distributed Storage Manager program 24 calculates a "change identifier" for each "granule" of the binary object and stores it in the "shadow file" for that binary object. Program control then continues with step 408 where the binary object is compressed into a compressed storage file 32 which becomes the most recent complete copy of the binary object for later reconstitution of the binary object as is discussed more fully hereinbelow. The contents of the compressed storage file 32 is then transmitted to the remote backup file server 12 for long-term storage and retrieval. Program control is then returned to step 400.

If the Distributed Storage Manager program 24 determines, in step 402, that this is not the first time that the binary object currently being processed is being backed up using the "granularization" technique, program control continues with step 410 where the Distributed Storage Manager program 24 calculates the "contents identifier" for each "granule". Program control continues with step 412 where each newly-calculated "contents identifier" is compared to the corresponding "contents identifier" for the "granule" in the "shadow file". If the two values are equal, program control continues with step 414 where the Distributed Storage Manager program 24 determines whether the last "granule" of the binary object has been processed. If so, program control is returned to step 400; otherwise, program control continues at step 410. If the "contents identifiers" are not found to be equal in step 412, the "granule" has changed and program control continues with step 416 where the "shadow file" is updated with the newly-calculated "contents identifier" for the "granule". Program control then continues with step 418 where the changed "granule" is compressed into a compressed storage file 32 using a special format that identifies the "granule". All changed "granules" for the "data stream" currently being processed are packed together in the same compressed storage file 32. The contents of the compressed storage file 32 is then transmitted to the remote backup file server 12 for long-term storage and retrieval. If the Distributed Storage Manager program 24 determines that a large percentage of the "granules" in the binary object have changed (e.g., 80%), then the entire binary object is backed up to the remote backup file server 12.

Figure 5H:
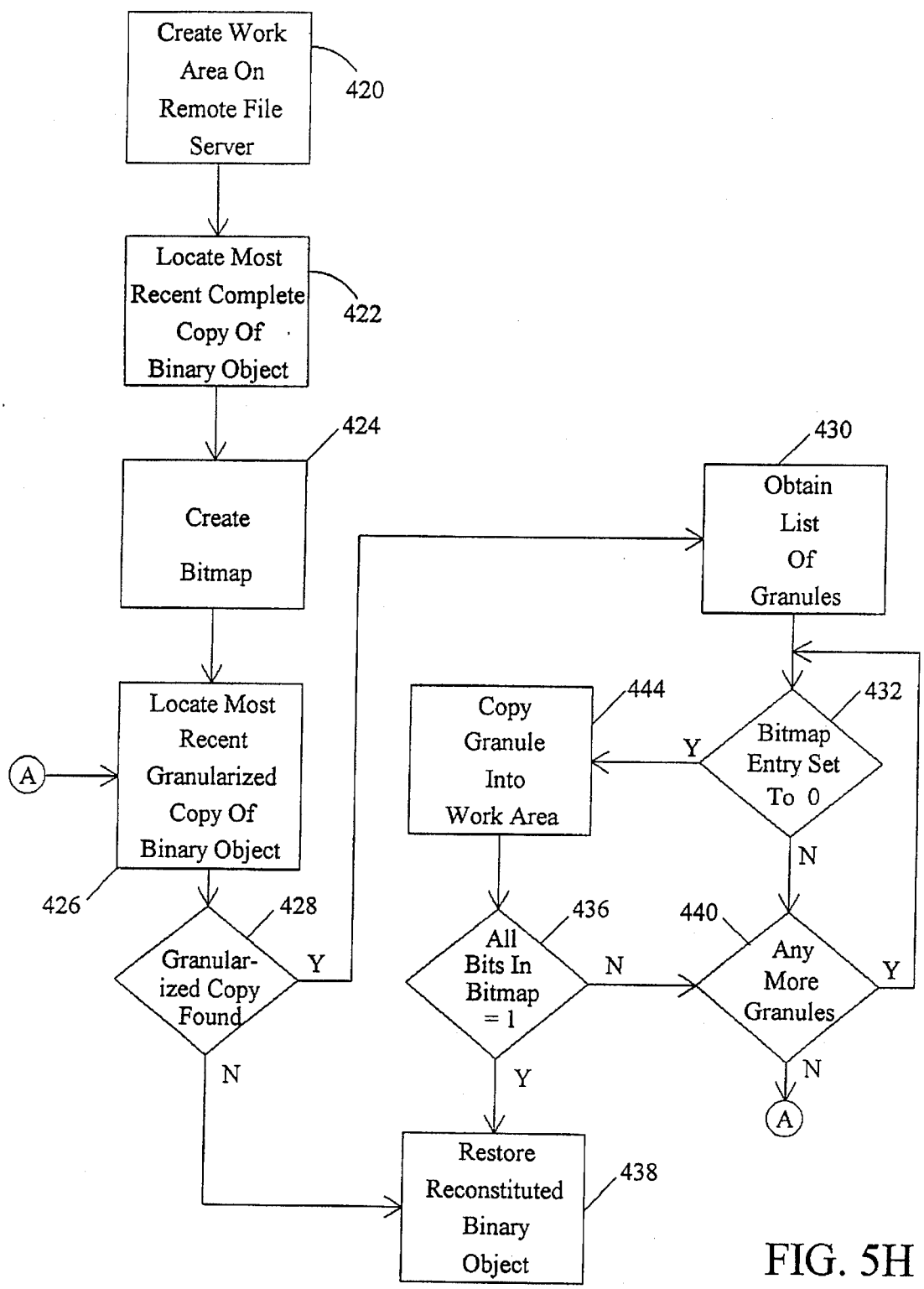
Figure 5I:
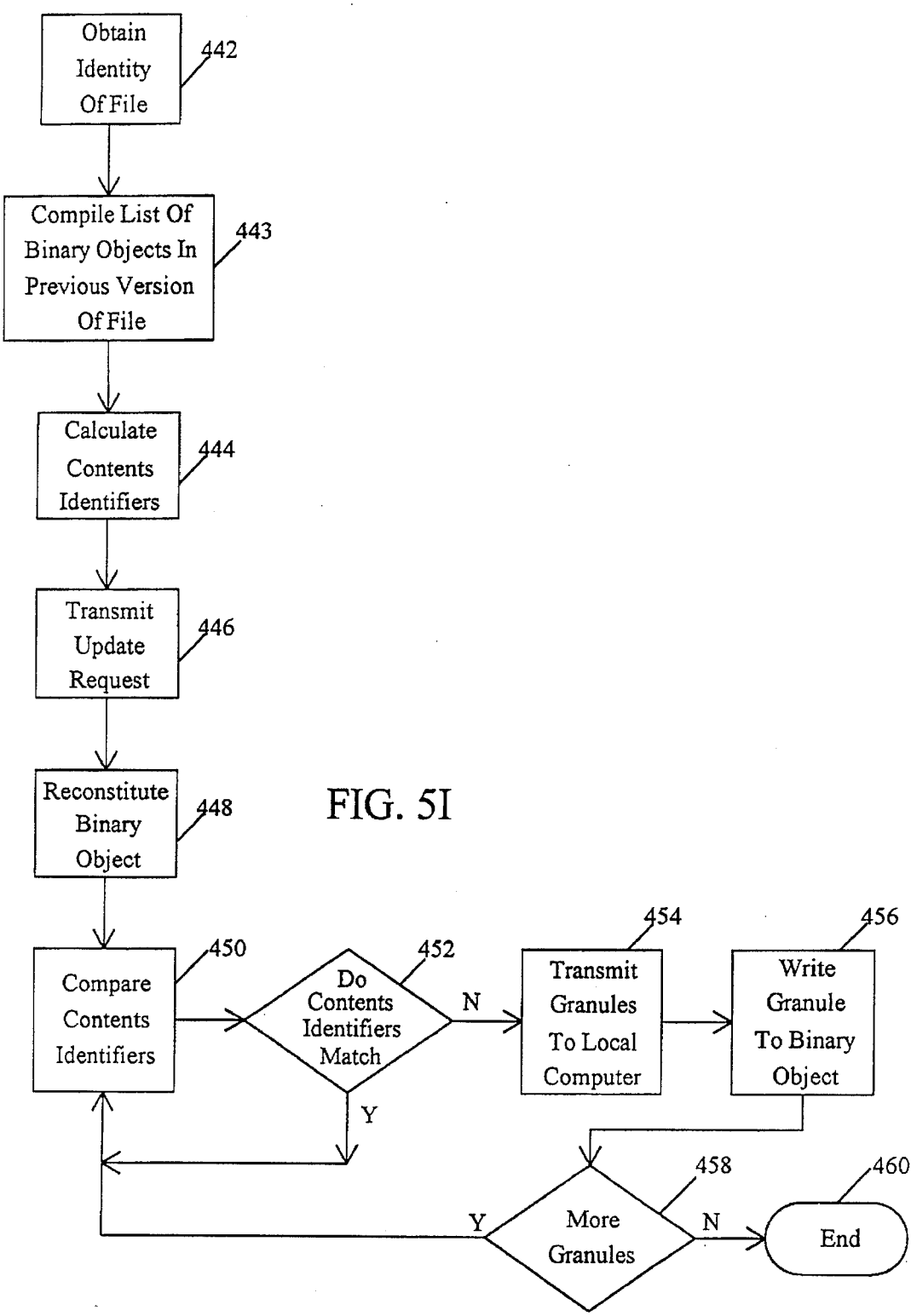
Figure 5J:
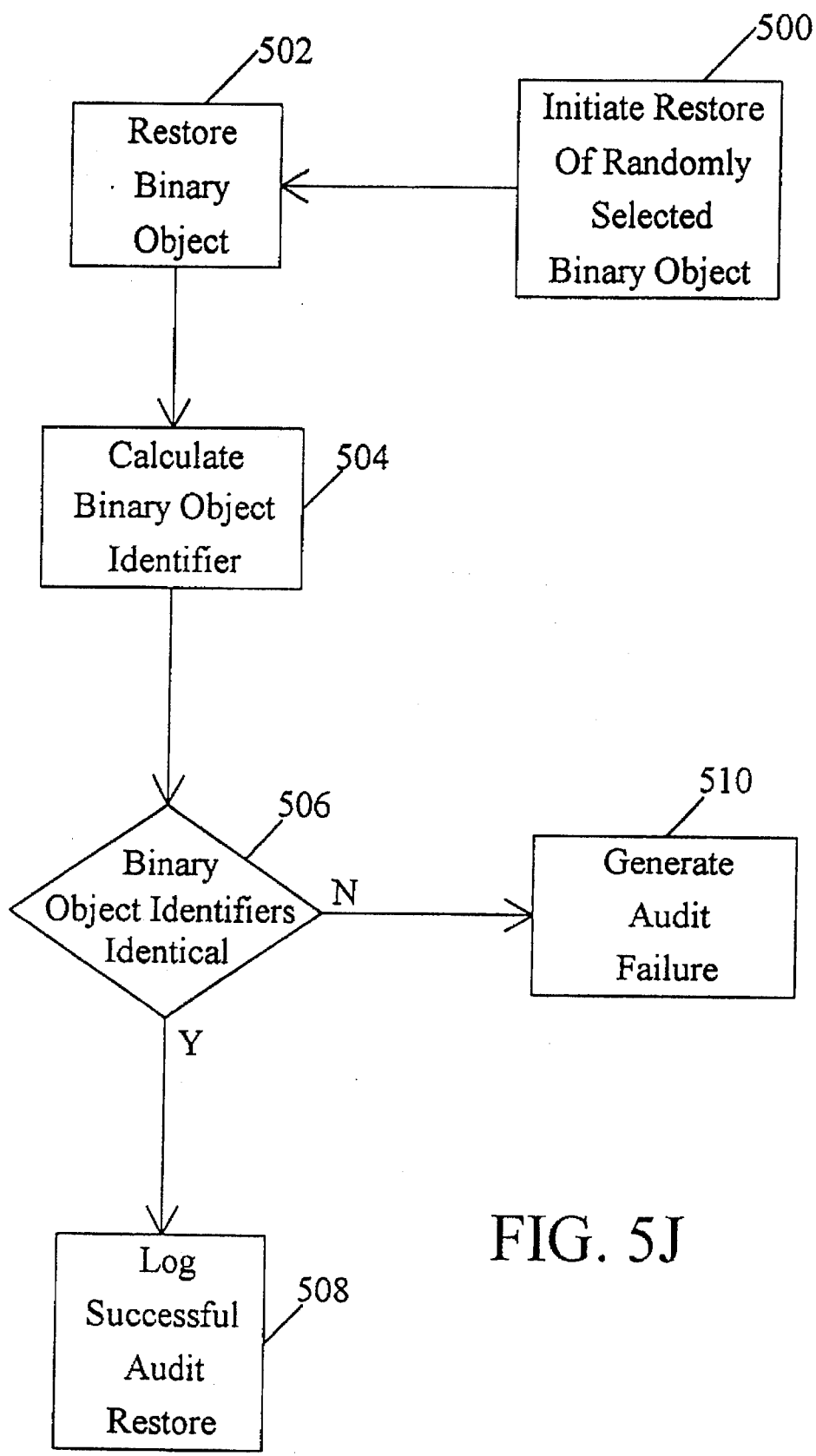

The operation of the Distributed Storage Manager program 24 in reconstituting, on a local computer 20, a binary object that has been transmitted to the remote backup file server 12 using the "granularization" technique illustrated in FIG. 5g is illustrated in the flow chart depicted in FIG. 5h. Program control begins at step 420 where the Distributed Storage Manager program 24 creates a work area on the remote backup file server 12 that is equal in size to the total uncompressed size of the binary object that is to be reconstituted. Program control continues with step 422 where the most recent complete copy of the binary object to be reconstituted is located on the remote backup file server 12 and is decompressed into the work area. Program control then continues with step 424 where the Distributed Storage Manager program 24 creates a bitmap with one bit representing each granule of the binary object to be reconstituted. Initially, all bits in this bitmap are set to zero (0). Each bit in the bitmap is used to indicate whether the granule associated with that bit has been restored to the most recent complete copy of the binary object. Program control then continues with step 426 where the Distributed Storage Manager program 24 locates the most recent "granularized" copy of the binary object that was stored on the remote backup file server 12. Each time that step 426 is executed, the next most recent "granularized" copy of the binary object is located. This process continues until all bits in the bitmap are set to one (1) or until there are no more "granularized" copies of the binary object that are newer than the most recent complete copy of the binary object. At that point, the binary object will have been reconstituted and will be ready to be restored to the local computer 20. Following step 426, program control continues with step 428 where the Distributed Storage Manager program 24 determines whether another "granularized" copy of the binary object has been located. If so, program control continues with step 430 where the Distributed Storage Manager program 24 obtains the list of "granules" in the "granularized" copy of the binary object just located. If another "granularized" copy of the binary object is not located in step 428, program control continues with step 438 where the reconstituted binary object is restored to the local computer 20. Following step 430, program control continues with step 432 where, starting with the first "granule" in the "granularized" copy of the binary object, the Distributed Storage Manager program 24 determines whether the bit for this "granule" in the bit map is set to zero (0). If the bit is set to one (1), a more recent copy of the "granule" has already been decompressed and copied into the work area. If the bit is set to zero (0), program control continues with step 434 where the "granule" is decompressed and copied into the work area at the correct location for that "granule". After copying the "granule" to the work area, the Distributed Storage Manager program 24 sets the bit within the bitmap for the "granule" to one (1). If the Distributed Storage Manager program 24 determines, in step 432, that the bit is not set to zero (0), program control continues with step 440 where the Distributed Storage Manager program 24 determines whether there are any more "granules" to be processed in the current set of "granules". If so, program control is returned to step 432; otherwise, program control is transferred to step 426. Following step 434, program control continues with step 436 where the Distributed Storage Manager program 24 determines whether all bits in the bitmap are now set to one (1). If so, program control continues with step 438 where the reconstituted binary object is restored to the local computer 20. If the Distributed Storage Manager program 24 determines, in step 436, that all bits in the bitmap are not set to one (1), program control continues with step 440.

The technique of "granularizing" "large" files also becomes useful when a current version of a file (comprised of current versions of binary objects) must be restored to a previous version of that file (comprised of previous versions of binary objects). Each binary object comprising the current version of the file can be restored to the binary object comprising the previous version of the file by restoring and updating only those "granules" of the current version of the binary objects that are different between the current and previous versions of the binary objects. This technique is illustrated in the flow chart depicted in FIG. 5i. Program control begins at step 442 where the Distributed Storage Manager program 24 obtains from the user the identities of the current and previous versions of the file (comprised of binary objects) which needs to be restored. Program control continues with step 443 where the Distributed Storage Manager program 24 compiles a list of all binary objects comprising the current version of the user-specified file. This information is obtained from File Database 25. Program control then continues with step 444 where the Distributed Storage Manager program 24 calculates "contents identifiers" for each "granule" within the current version of each binary object as it exists on the local computer 20. Program control then continues with step 446 where the Distributed Storage Manager program 448 transmits an "update request" to the remote backup file server 12 which includes the Binary Object Identification Record 58 for the previous version of each binary object as well as the list of "contents identifiers" calculated in step 444. Program control continues with step 448 where the Distributed Storage Manager program 24 reconstitutes each previous version of the binary objects according to the technique illustrated in the flow chart depicted in FIG. 5h. Program control then continues with step 450 where the Distributed Storage Manager program 24, for each binary object, compares the "contents identifier" of the next "granule" in the work area of remote backup file server 12 against the corresponding "contents identifier" calculated in step 444. Program control continues with step 452 where the Distributed Storage Manager program 24 determines whether the "contents identifiers" match. If so, program control is returned to step 450 since this "granule" is the same on the local computer 20 and on the remote backup file server 12. If the Distributed Storage Manager program 24 determines, in step 452, that the "contents identifiers" do not match, program control continues with step 454 where the Distributed Storage Manager program 24 transmits the "granule" to the local computer 20. Program control then continues with step 456 where the "granule" received by the local computer 20 is written directly to the current version of the binary object at the appropriate location. Program control then continues with step 458 where the Distributed Storage Manager program 24 determines whether there are any more "granules" to be examined for the binary object currently being processed. If so, program control is returned to step 450; otherwise the file restore routine is terminated at step 460. After all "granules" are received from the remote backup file server 12, the binary object has been restored to the state of the previous version.

5. Auditing and Reporting

The Distributed Storage Manager program 24 is able to perform self-audits on a periodic basis to ensure that the binary objects that have been backed up can be restored. To perform an audit, the Distributed Storage Manager program 24 executes the steps illustrated in the flow chart of FIG. 5j. Program control begins at step 500 where the Distributed Storage Manager program 24 initiates a restore of a randomly selected binary object identified by a Binary Object Identification Record 58 stored in File Database 25. Program control continues with step 502 where the selected binary object is restored from either a compressed storage file 32 residing on one of the disk drives 19 of one of the local computers 20 or from the remote backup file server 12. Program control then continues with step 504 where, as the binary object is being restored, a Binary Object Identifier 74 is calculated from the binary object instead of writing the binary object to one of the disk drives 19 of one of the local computers 20. Program control then continues with step 506 where the Distributed Storage Manager program 24 compares the Binary Object Identifier 74 calculated in step 504 to the original Binary Object Identifier 74 stored as part of the randomly selected Binary Object Identification Record 58. If the values are equal, program control continues with step 508 where the Distributed Storage Manager program 24 logs a successful audit restore. If the values are not equal, program control continues with step 510 where the Distributed Storage Manager program 24 generates an event indicating an audit failure.

6. Virtual Restore

The disk drives 19 associated with local computers 20 may have a very large storage capacity and may require a significant amount of time to be restored, especially if most or all of the data must be transmitted from the remote backup file server 12. To reduce the amount of time that a local computer 20 is "offline" during a full disk drive 19 restore, the Distributed Storage Manager program 24 employs a technique which allows a disk drive 19 associated with a local computer 20 to be only partially restored before being put back "online" for access by local computer 20. The user specifies to the Distributed Storage Manager program 24 that only those files that have been accessed in the last <n> days, <n> weeks or <n> months should be restored to the disk drive 19 before the disk drive 19 is returned to the "online" state. Alternately, the user may specify that only files that are stored "locally" in compressed storage files 32 should be restored and that no files stored on the remote backup file server 12 should be restored before the disk drive 19 is returned to the "online" state. The overall result is a minimization of restore time in the event of disk drive 19 failure. This "virtual restore" technique generally works quite well since users who will begin accessing data on a particular disk drive 19 after it is put back "online" will most likely only be accessing data that had been "recently" accessed before failure of the disk drive 19.

Figure 5K:
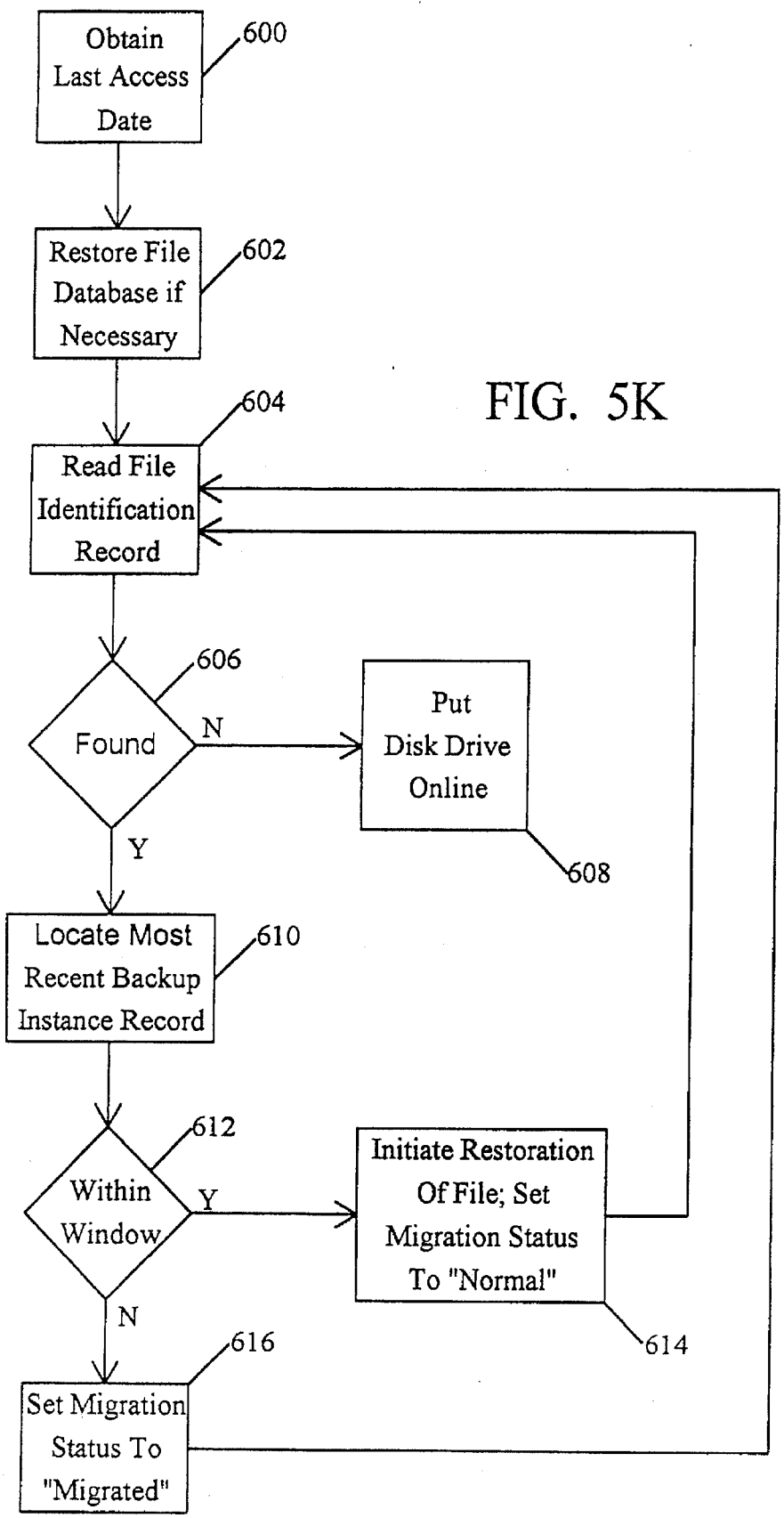
Figure 5L:
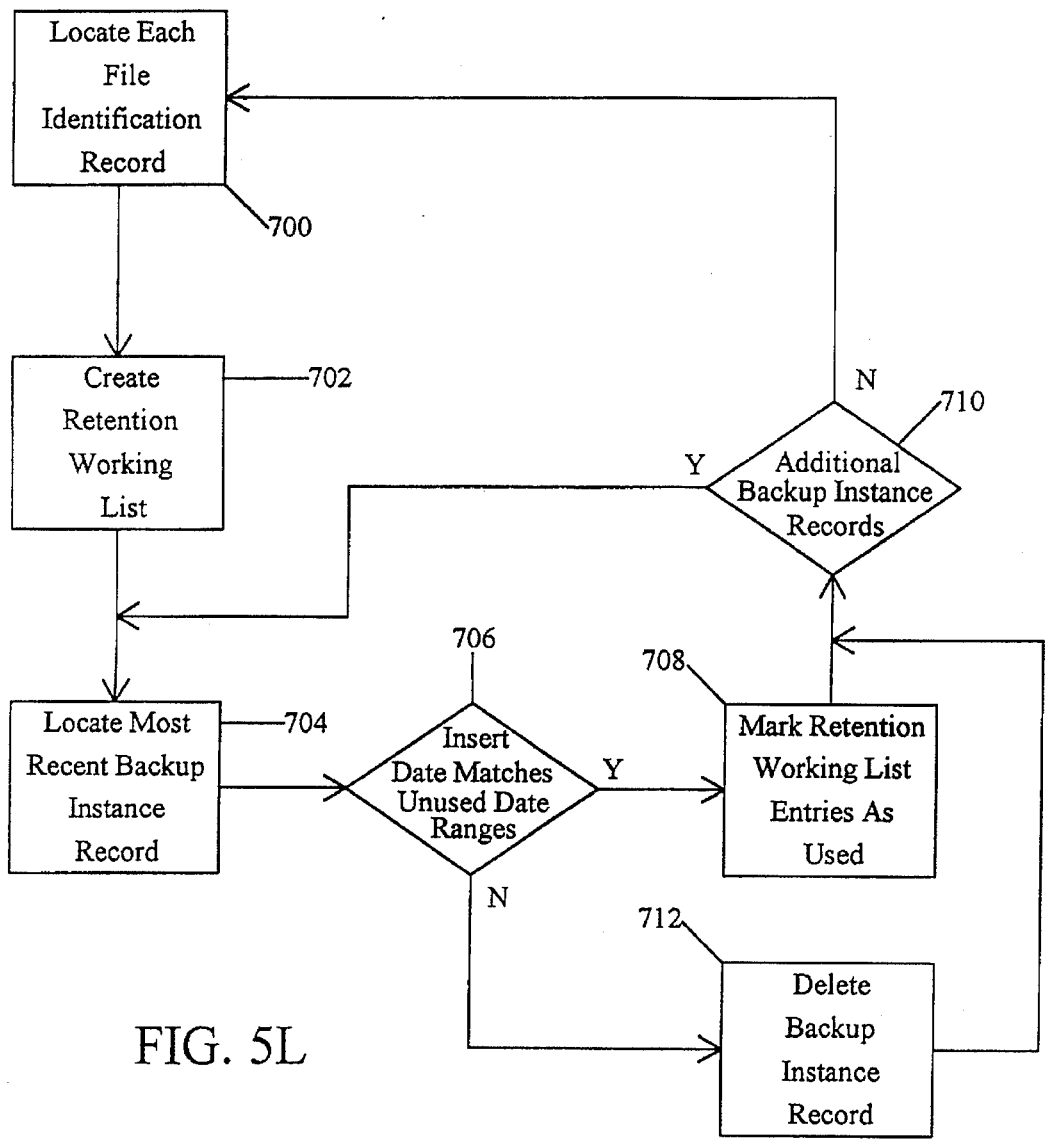

The "virtual restore" process is illustrated in the flow chart depicted in FIG. 5k. Program control begins at step 600 where the Distributed Storage Manager program 24 obtains, from the user, the last access date that defines which files must be restored before the disk drive 19 can be returned to the "online" condition. Any files that were last accessed on or after this date will be restored before the disk drive 19 is placed "online". The specification of this date may be accomplished in any of the following ways: (1) actual date; (2) "within the last <n> days"; (3) "within the last <n> weeks"; or (4) "within the last <n> months". Alternately, the user may specify that only files that are currently backed up in compressed storage files 32 are to be restored as opposed to files stored on remote backup file server 12. Program control continues with step 602 where the Distributed Storage Manager Program 24 locates the most recent version of the File Database 25 for the disk drive 19 to be restored if the File Database 25 does not already exist on the disk drive 19. Program control then continues with step 604 where the next File Identification Record 34 in File Database 25 is read. Program control continues with step 606 where the Distributed Storage Manager program 24 determines whether an additional File Identification Record 34 to be processed has been located in File Database 25. If not, program control continues with step 608 where the Distributed Storage Manager program 24 notifies the local computer 20 that the restored disk drive 19 may be placed "online" and terminates the virtual restore process. If another File Identification Record 34 has been located for processing, program control continues with step 610 where the Distributed Storage Manager program 24 locates the most recent Backup Instance Record 42 associated with the File Identification Record 34 currently being processed. In step 612, the Distributed Storage Manager program 24 determines whether the Last Access Date/Time field 52 in the Backup Instance Record 52 indicates that the file has been accessed since the user-specified last access date (step 600). If the file has been accessed on or since the user-specified last access date, program control continues with step 614 where the Distributed Storage Manager program 24 initiates the restoration of this file and sets the Migration Status field 41 in the File Identification Record 34 currently being processed to "NORMAL". Program control is then returned to step 604. If the Distributed Storage Manager program 24 determines, in step 612, that the file has not been accessed on or since the user-specified last access date, program control continues with step 616 where the Distributed Storage Manager program 24 sets the Migration Status field 41 in the File Identification Record 34 currently being processed to "MIGRATED". In this case, the file does not need to be restored. Program control is then returned to step 604.

Another feature of the virtual restore process is the ability to utilize the Migration Status field 41 in File Identification Record 34 for the performance of space management. If a particular file has not been accessed on or since a user-specified last access date, the file can be backed up to the remote backup file server 12 and then deleted from the disk drives 19 associated with local computers 20. The Migration Status field 41 is then set to "MIGRATED". If a migrated file is later needed by a user, the file can be restored from the remote backup file server 12.

7. Backup File Retention

The Distributed Storage Manager program 24 implements a backup file retention scheme wherein a retention pattern is maintained for each individual file that indicates which backup versions of a file are to be saved. A retention pattern for a file is defined as:

keep the last "d" daily backup copies of the file AND
keep the last "w" weekly backup copies of the file AND
keep the last "m" monthly backup copies of the file AND
keep the last "q" quarterly backup copies of the file AND
keep the last "y" yearly backup copies of the file.

By specifying the retention pattern in this way, all backup copies of a file that are needed to represent the backup of the file as it existed at the time it was backed up for the last "d" days, the last "w" weeks, the last "m" months, the last "q" quarters and the last "y" years are saved. However, by way of example, this may mean that only one backup copy of the file is saved to represent all "d" days (in the case where the file has not changed in the last "d" days), or this may mean that the last "d" daily backup copies of the file must be saved to represent the file as it existed for the last "d" daily backup cycles. The same principle is utilized for weekly, monthly, quarterly and yearly copies.

The backup file retention scheme utilized by the Distributed Storage Manager program 24 provides several unique benefits. First, this technique prevents undetected virus or application program damage to a file from destroying all good backup copies of a file. If a file is damaged and this condition is not noticed for several days, then a scheme which only maintains the last "n" versions of a file may result in the situation where an "undamaged" backup copy of the file is not available. The backup file retention scheme of the present invention allows backup copies of files to be kept that represent the file as it existed at various times during the past several days, weeks, months or even years. Second, the file retention scheme utilized by the Distributed Storage Manager program 24 eliminates the need for most archives. Most archives are designed to take a snapshot of a group of files as of a certain date, such as at the end of each month. The Distributed Storage Manager program's use of retention patterns eliminates the need for users to take periodic snapshots of their data using a special archive, since the Distributed Storage Manager program 24 handles this automatically.

In order for the Distributed Storage Manager program 24 to implement the backup file retention scheme, each file stored on the local computers 20 must be associated with a specific retention pattern. The Management Class field 43 in the File Identification Record 34 of File Database 25 specifies a management class for each file. In turn, each management class is associated with a specific file retention pattern. In this way, a specific retention pattern is associated with each file. Those of ordinary skill in the art will recognize that other methods of assigning a specific file retention pattern to a file may also be utilized.

The operation of the backup file retention scheme utilized by the Distributed Storage Manager program 24 is illustrated in the flow chart of FIG. 51. Program control begins at step 700 where the Distributed Storage Manager program 24 locates each File Identification Record 34 in the File Database 25. Program control continues at step 702 where the Distributed Storage Manager program 24 determines the required file retention pattern by examining the Management Class field 43 in the File Identification Record 34 currently being processed and then creates a "retention working list". The "retention working list" is a list of entries that specify the starting and ending dates for each backup copy that should be retained based upon the specified retention pattern. For example, if the user has specified that the last "d" daily backup copies must be retained, then the "retention working list" will contain "d" entries with the "start date" equal to the "end date" for each entry and the dates for the first entries set equal to the current dater the dates for the second entries set equal to the previous day's date, etc. For weekly entries, the "retention working list" will contain entries (one per weekly backup copy to be retained) with the "start date" set to the date that specifies the beginning of the prior week (based on the current date) and the "end date" set to the date that specifies the end of the prior week (based on the current date). If "w" weeks are to be retained, then "w" weekly "retention working list" entries will be created. At the end of this process, the "retention working list" will contain a list of "windows" which indicates the date ranges that a file must fall within in order to be retained.

Program control continues with step 704 where the Distributed Storage Manager program 24 locates the most recent Backup Instance Record 42 associated with the File Identification Record 34 currently being processed. Program control continues with step 706 where the Distributed Storage Manager program 24 compares the date stored in the Insert Date field 57 of the Backup Instance Record 42 currently being processed with any "unused" date ranges set forth in the "retention working list" (if any of the "retention working list" entries have already been satisfied, they will be marked as "used" as is discussed more fully below in relation to step 708). If the date stored in the Insert Date field 57 does not fall within any of the "unused" "retention working list" date ranges, then program control continues with step 712 where the Backup Instance Record 42 is deleted. Otherwise, program control continues with step 708 where all "retention working list" entries satisfied by the date stored in the Insert Date Field 57 are marked as "used" to indicate that a Backup Instance Record 42 has been used to satisfy this entry. This ensures that an older Backup Instance Record 42 is not used to satisfy a retention pattern specification when a newer entry also satisfies the condition. The Distributed Storage Manager program 24 also checks to ensure that the file associated with the Backup Instance Record 42 has not been deleted prior to the "end date" of the window satisfied by the date stored in Insert Date field 57. This condition is satisfied by ensuring that the date stored in the Delete Date field 56 of the Backup Instance Record 42 currently being processed is after the "end date" of the window satisfied by the date stored in Insert Date field 57. If the file was deleted prior to the "end date" of the window, then the file cannot be used to satisfy the "retention working list" entry since that file did not exist on the "end date". Following either step 708 or step 712, program control continues with step 710 where the Distributed Storage Manager program 24 determines whether there are any additional Backup Instance Records 42 associated with the File Identification Record 34 currently being processed. If so, program control is returned to step 704; otherwise, program control is returned to step 700.

While the present invention has been described in connection with an exemplary embodiment thereof, it will be understood that many modifications and variations will be readily apparent to those of ordinary skill in the art. This disclosure and the following claims are intended to cover all such modifications and variations.

We claim:

1. A system for distributed management of the storage space and data on a networked computer system wherein the networked computer system includes at least two storage devices for storing data files, said distributed storage management system comprising:

means for selectively copying data files stored on one of the storage devices to another of the storage devices;

means for dividing each data file into one or more binary objects of a predetermined size;

means for calculating a current value for a binary object identifier for each binary object within a file, said calculation of said binary object identifier being based upon the actual data contents of the associated binary object, said calculated binary object identifier being saved as the name of the associated binary object;

means for comparing said current name of a particular binary object to one or more previous names of said binary object;

means for storing said current name of said binary object; and means for controlling said means for selectively copying binary objects in response to said means for comparing.

2. The distributed storage management system of claim 1 wherein said means for calculating said current name includes means for calculating a current name comprised of at least two independently determined values.

3. The distributed storage management system of claim 1 wherein said means for calculating said current name includes means for calculating a 128-bit binary value comprised of four 32-bit fields.

4. The distributed storage management system of claim 3 wherein said four 32-bit fields include a binary object identifier size field, a Cyclical Redundancy Check number field calculated against the contents of the binary object, a Longitudinal Redundancy Check number field calculated against the contents of the binary object, and a binary object hash number field calculated against the contents of the binary object.

5. The distributed storage management system of claim 1 further including means for auditing the performance of said distributed storage management system, said means for auditing including:

second means for controlling said means for selectively copying binary objects to recopy a previously copied binary object;

means for recalculating said binary object identifier for the recopied binary object, said recalculated binary object identifier being saved as the name of the associated binary object;

means for comparing said recalculated name to a previous name of said binary object; and means for reporting a failure if said recalculated name is not identical to said previous name of said binary object.

6. The distributed storage management system of claim 1 wherein said means for controlling said means for selectively copying includes means for instructing, in response to said means for comparing, said means for selectively copying to copy a particular binary object only if its current name is not identical to a previous name for that particular binary object.

7. The distributed storage management system of claim 1 additionally comprising means for segmenting the binary objects into granules of data, and wherein said granules of data are processed in the same manner as said binary objects.

8. The distributed storage management system of claim 7 further including means for reconstructing a binary object from a most recent complete copy of the binary object, said means for reconstructing including:

means for copying said granules copied by said means for selectively copying granules to said most recent complete copy of the binary object in order from most-recently copied granule to least-recently copied granule; and means for generating a bitmap for controlling said means for copying said copied granules.

9. The distributed storage management system of claim 8 wherein said means for calculating said current name for said granule includes means for calculating a 32-bit Cyclical Redundancy Check number calculated against the contents of said granule and means for calculating a 32-bit binary object hash number calculated against the contents of said granule.

10. The distributed storage management system of claim 8 further including means for restoring a current version of a binary object to a previous version of that binary object, said means for restoring including:

means for calculating said name for each of said granules in the current version of the binary object;

means for comparing said calculated name to a previous name for each of said granules in the current version of the binary object; and means, responsive to said means for comparing said names, for replacing those granules in the current version of the binary object for which said names are not identical.

11. The distributed storage management system of claim 1 additionally comprising;

means for indicating which of said copied binary objects must be copied to a particular storage device in the event of a failure of that storage device before that storage device is considered to be operable by the local computer with which that storage device is in communication; and wherein said means for controlling said means for selectively copying binary objects is further responsive to said means for indicating.

12. The distributed storage management system of claim 11 wherein said means for indicating includes means for specifying a last access date such that only binary objects that have been accessed by the networked computer system on or after said last access date must be copied to a particular storage device before that storage device is considered to be operable.

13. The distributed storage management system of claim 1 additionally comprising:

means for maintaining a file retention list wherein said file retention list includes a file retention pattern for each binary object copied by said means for selectively copying binary objects;

means for determining which of the binary objects copied by said means for selectively copying binary objects match each of said file retention patterns; and means for deleting the binary objects from the storage devices in response to said means for determining.

14. The distributed storage management system of claim 13 wherein said file retention pattern includes daily, weekly, monthly, quarterly and yearly retention patterns.

15. The distributed storage management system of claim 1 wherein said networked computer system includes a remote backup, file server, and wherein said means for selectively copying copies the binary objects stored on one of the storage devices to another of the storage devices or to the remote backup file server, said distributed storage management system additionally, comprising:

means for employing user-defined priorities to determine which binary objects are to be copied to another storage device and to determine a queuing sequence for copying binary objects to the remote backup file server.

16. A method for management of the storage space and data on a computer system wherein the computer system includes at least two storage areas for storing data files, said method comprising the steps of:

dividing each data file into one or more binary objects of a predetermined size;

calculating a current value for a binary object identifier for each binary object within a file, said calculation of said binary object identifier being based upon the actual data contents of the associated binary object, said calculated binary object identifier being saved as the name of the associated binary object;

comparing said current name of said binary object to one or more previous names of said binary object;

storing said current name of said binary object as a previous name of said binary object; and selectively copying binary objects in response to said comparing step.

17. The method of claim 16 wherein said step of calculating said current name for said binary object includes the step of calculating a current name for a binary object comprised of at least two independently determined values.

18. The method of claim 16 wherein said step of calculating said current name for said binary object includes the step of calculating a current name for a binary object utilizing a 128-bit binary value comprised of four 32-bit fields and wherein said four 32-bit fields include a binary object identifier size field, a Cyclical Redundancy Check number field calculated against the contents of the Binary object, a Longitudinal Redundancy Check number field calculated against the contents of the binary object, and a binary object hash number field calculated against the contents of the binary object.

* * * * *